US011728434B2

(12) United States Patent
Kim et al.

(10) Patent No.: US 11,728,434 B2
(45) Date of Patent: Aug. 15, 2023

(54) SEMICONDUCTOR DEVICE

(71) Applicant: SAMSUNG ELECTRONICS CO., LTD., Suwon-si (KR)

(72) Inventors: Seok Hoon Kim, Suwon-si (KR); Dong Myoung Kim, Suwon-si (KR); Dong Suk Shin, Yongin-si (KR); Seung Hun Lee, Hwaseong-si (KR); Cho Eun Lee, Pocheon-si (KR); Hyun Jung Lee, Hwaseong-si (KR); Sung Uk Jang, Hwaseong-si (KR); Edward Nam Kyu Cho, Seongnam-si (KR); Min-Hee Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 17/011,221

(22) Filed: Sep. 3, 2020

(65) Prior Publication Data
US 2020/0403100 A1 Dec. 24, 2020

Related U.S. Application Data

(63) Continuation of application No. 15/995,414, filed on Jun. 1, 2018, now Pat. No. 10,784,379.

(30) Foreign Application Priority Data

Aug. 30, 2017 (KR) .................. 10-2017-0110247

(51) Int. Cl.
*H01L 29/78* (2006.01)
*H01L 29/66* (2006.01)
(Continued)

(52) U.S. Cl.
CPC .... *H01L 29/7855* (2013.01); *H01L 21/02532* (2013.01); *H01L 21/76871* (2013.01);
(Continued)

(58) Field of Classification Search
CPC ........ H01L 21/02532; H01L 21/02645; H01L 21/02647; H01L 21/0265; H01L 21/76871;
(Continued)

(56) References Cited

U.S. PATENT DOCUMENTS 9,287,357 B2 * 3/2016 Rodder .............. H01L 21/8258
9,337,031 B2    5/2016 Kim et al.
(Continued)

FOREIGN PATENT DOCUMENTS

CN    103165459 B    1/2016
CN    106206580 A    12/2016
(Continued)

OTHER PUBLICATIONS

IOS Invitation to respond Search Report & Written Opinion dated Oct. 19, 2018 (Singapore), in partent U.S. Appl. No. 15/995,414.
(Continued)

*Primary Examiner* — Andres Munoz
(74) *Attorney, Agent, or Firm* — Lee IP Law, P.C.

(57) ABSTRACT

A semiconductor device includes a first fin type pattern on a substrate, a second fin type pattern, parallel to the first fin type pattern, on the substrate, and an epitaxial pattern on the first and second fin type patterns. The epitaxial pattern may include a shared semiconductor pattern on the first fin type pattern and the second fin type pattern. The shared semiconductor pattern may include a first sidewall adjacent to the first fin type pattern and a second sidewall adjacent to the second fin type pattern. The first sidewall may include a first lower facet, a first upper facet on the first lower facet and a first connecting curved surface connecting the first lower and upper facets. The second sidewall may include a second lower facet, a second upper facet on the second lower facet (Continued)

and a second connecting curved surface connecting the second lower and upper facets.

12 Claims, 30 Drawing Sheets

(51) Int. Cl.
| | | |
|---|---|---|
| *H01L 21/8234* | (2006.01) | |
| *H01L 21/768* | (2006.01) | |
| *H01L 21/02* | (2006.01) | |
| *H01L 29/423* | (2006.01) | |
| *H01L 29/165* | (2006.01) | |
| *H01L 27/088* | (2006.01) | |
| *H01L 29/08* | (2006.01) | |
| *H01L 29/49* | (2006.01) | |
| *H01L 27/12* | (2006.01) | |

(52) U.S. Cl.
CPC .. *H01L 21/823431* (2013.01); *H01L 27/0886* (2013.01); *H01L 29/0847* (2013.01); *H01L 29/165* (2013.01); *H01L 29/4232* (2013.01); *H01L 29/6656* (2013.01); *H01L 29/66795* (2013.01); *H01L 29/785* (2013.01); *H01L 21/02645* (2013.01); *H01L 27/1211* (2013.01); *H01L 29/4966* (2013.01); *H01L 29/66545* (2013.01)

(58) Field of Classification Search
CPC ......... H01L 21/823431; H01L 27/0886; H01L 27/1211; H01L 29/0847; H01L 29/165; H01L 29/4232; H01L 29/4966; H01L 29/66484; H01L 29/66545; H01L 29/6656; H01L 29/66795; H01L 29/785–7855
See application file for complete search history.

(56) References Cited

U.S. PATENT DOCUMENTS

| | | | |
|---|---|---|---|
| 9,379,215 B2 | 6/2016 | Lin et al. | |
| 9,391,201 B2 | 7/2016 | Huang et al. | |
| 9,397,006 B1 | 7/2016 | Ok et al. | |
| 9,437,496 B1 | 9/2016 | Chudzik et al. | |
| 9,484,348 B2 | 11/2016 | Basker et al. | |
| 9,595,518 B1 | 3/2017 | Chou et al. | |
| 9,595,611 B2 | 3/2017 | Kim et al. | |
| 9,947,756 B2 | 4/2018 | Li et al. | |
| 10,002,923 B2 | 6/2018 | Cheng et al. | |
| 10,026,662 B2 | 7/2018 | Sung et al. | |
| 10,038,095 B2 | 7/2018 | Li et al. | |
| 10,141,231 B1 | 11/2018 | Yang et al. | |
| 10,163,635 B1 | 12/2018 | Qi et al. | |
| 10,170,370 B2 | 1/2019 | Cheng et al. | |
| 10,243,045 B2 | 3/2019 | Yu et al. | |
| 10,269,907 B2 | 4/2019 | Li et al. | |
| 10,297,601 B2 | 5/2019 | Kim et al. | |
| 10,304,932 B2 | 5/2019 | Kim et al. | |
| 10,355,000 B2 | 6/2019 | Choi et al. | |
| 10,396,078 B2 | 8/2019 | Holt et al. | |
| 10,431,503 B2 | 10/2019 | Adusumilli et al. | |
| 2011/0073952 A1 | 3/2011 | Kwok et al. | |
| 2014/0217517 A1 | 8/2014 | Cai et al. | |
| 2015/0035023 A1* | 2/2015 | Kim | H01L 29/66795 257/288 |
| 2015/0333061 A1 | 11/2015 | Kim et al. | |
| 2016/0027918 A1 | 1/2016 | Kim et al. | |
| 2016/0049515 A1 | 2/2016 | Basker et al. | |
| 2016/0079248 A1 | 3/2016 | Basker et al. | |
| 2016/0111447 A1 | 4/2016 | Bryant et al. | |
| 2016/0020209 A1 | 6/2016 | Anderson et al. | |
| 2016/0190017 A1 | 6/2016 | Lee et al. | |
| 2016/0197182 A1 | 7/2016 | Li | |
| 2016/0293697 A1 | 10/2016 | Kim et al. | |
| 2016/0293717 A1 | 10/2016 | Kim et al. | |
| 2016/0322493 A1 | 11/2016 | Wang et al. | |
| 2016/0351570 A1 | 12/2016 | Park et al. | |
| 2016/0372472 A1 | 12/2016 | Kim | |
| 2017/0053916 A1 | 2/2017 | Ching et al. | |
| 2017/0076973 A1 | 3/2017 | Lee et al. | |
| 2017/0077228 A1 | 3/2017 | Lee et al. | |
| 2017/0084449 A1 | 3/2017 | Dube et al. | |
| 2017/0098648 A1 | 4/2017 | Lee et al. | |
| 2017/0148797 A1 | 5/2017 | Kim et al. | |
| 2017/0200718 A1 | 7/2017 | Choi et al. | |
| 2017/0243944 A1 | 8/2017 | Li et al. | |
| 2017/0256613 A1 | 9/2017 | Fung | |
| 2019/0245076 A1 | 8/2019 | Seong et al. | |

FOREIGN PATENT DOCUMENTS

| | | |
|---|---|---|
| CN | 106206595 A | 12/2016 |
| CN | 106486547 A | 3/2017 |
| CN | 106920776 A | 7/2017 |
| CN | 107093630 A | 8/2017 |
| EP | 2 701 197 A1 | 2/2014 |
| KR | 10-1018893 B1 | 3/2011 |
| KR | 10-2015-0015778 A | 8/2013 |
| KR | 10-2016-0116423 A | 10/2016 |
| KR | 10-2016-0119889 A | 10/2016 |

OTHER PUBLICATIONS

Indian Examination Report dated Oct. 29, 2020 for corresponding Indian Application No. 201834018605.
Korean Notice of Allowance dated Aug. 8, 2022 for corresponding KR 10-2017-0110247.
Chinese Office action dated Mar. 30, 2023 for corresponding CN 201810993514.X.

\* cited by examiner

SEMICONDUCTOR DEVICE

CROSS-REFERENCE TO RELATED APPLICATION

This application is a continuation of U.S. patent application Ser. No. 15/995,414 filed Jun. 1, 2018, which is incorporated by reference herein in its entirety.

Korean Patent Application No. 10-2017-0110247 filed on Aug. 30, 2017 in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

As one of scaling techniques for increasing the density of semiconductor devices, a multi-gate transistor which forms a fin-shaped silicon body on a substrate and forms a gate on the surface of the silicon body have been suggested.

Since such a multi-gate transistor uses a three-dimensional channel, it is easily scaled. Further, the current control capability can be improved even without increasing a gate length of the multi-gate transistor. Additionally, it is possible to effectively suppress a SCE (short channel effect) in which the potential of the channel region is influenced by the drain voltage.

SUMMARY

According to some embodiments, there is provided a semiconductor device including a first fin type pattern on a substrate, a second fin type pattern on the substrate and the second fin type pattern in parallel with the first fin type pattern and an epitaxial pattern on the first fin type pattern and the second fin type pattern, The epitaxial pattern includes a shared semiconductor pattern on the first fin type pattern and the second fin type pattern. The shared semiconductor pattern may include a first sidewall adjacent to the first fin type pattern and a second sidewall adjacent to the second fin type pattern. The first sidewall of the shared semiconductor pattern may include a first lower facet, a first upper facet on the first lower facet and a first connecting curved surface connecting the first lower facet and the first upper facet. The second sidewall of the shared semiconductor pattern may include a second lower facet, a second upper facet on the second lower facet and a second connecting curved surface connecting the second lower facet and the second upper facet.

According to some embodiments, there is provided a semiconductor device including a first fin type pattern on a substrate, a second fin type pattern on the substrate and the second fin type pattern in parallel with the first fin type pattern and an epitaxial pattern on the first fin type pattern and the second fin type pattern. The epitaxial pattern includes a shared semiconductor pattern on the first fin type pattern and the second fin type pattern. The shared semiconductor pattern may include a first sidewall adjacent to an outer sidewall of the first fin type pattern, a second sidewall adjacent to an outer sidewall the second fin type pattern, an upper surface connecting the first sidewall and the second sidewall; and a bottom surface extending between an inner sidewall of the first fin type pattern and to an inner sidewall of the second fin pattern, wherein a height a lowest portion of the bottom surface to a highest portion of the bottom surface along the first direction is smaller than a height form the highest portion of the bottom surface to the upper surface overlapping the highest portion of the bottom surface.

According to some embodiments, there is provided a semiconductor device including a first fin type pattern and a second fin type pattern separated by a first distance on a substrate, a third fin type pattern and a fourth fin type pattern separated by a second distance larger than the first distance on the substrate, a first epitaxial pattern on the first fin type pattern and the second fin type pattern and a second epitaxial pattern on the third fin type pattern and the fourth fin type pattern, wherein the first epitaxial pattern includes a first shared semiconductor pattern on the first fin type pattern and the second fin type pattern and a first capping semiconductor pattern which is extended along a first sidewall and a second sidewall of the first shared semiconductor pattern, the second epitaxial pattern includes a second shared semiconductor pattern on the third fin type pattern and the fourth fin type pattern and a second capping semiconductor pattern which is extended along a third sidewall and a fourth sidewall of the second shared semiconductor pattern, the first sidewall of the first shared semiconductor pattern includes a first lower facet, a first upper facet on the first lower facet, a first connecting curved surface connecting the first lower facet and the first upper facet, the third sidewall of the second shared semiconductor pattern includes a second lower facet, a second upper facet on the second lower facet, a second connecting curved surface connecting the second lower facet and the second upper facet, un upper surface of the first shared semiconductor pattern and an upper surface of the second shared semiconductor pattern include the uppermost portion and the lowermost portion, respectively, and a difference in height between the uppermost portion and the lowermost portion with respect to the upper surface of the first shared semiconductor pattern is smaller than a difference in height between the uppermost portion and the lowermost portion with respect to the upper surface of the second shared semiconductor pattern.

According to some embodiments, there is provided a method of manufacturing semiconductor device includes forming a first fin type pattern and a second fin type pattern on a substrate, and the first fin type pattern in parallel with the second fin type pattern, forming a pre-shared semiconductor pattern on the first fin type pattern and the second fin type pattern and the a pre-shared semiconductor pattern includes a first pre sidewall extending from the first fin type pattern and a second pre sidewall extending from the second fin type pattern, forming a shared semiconductor pattern by performing a hydrogen treatment on the pre-shared semiconductor pattern, and the shared semiconductor pattern includes a first sidewall and a second sidewall, wherein the first sidewall includes a first lower facet, a first upper facet on the first lower facet, and a first connecting curved surface connecting the first lower facet and the first upper facet and the second sidewall includes a second lower facet, a second upper facet on the second lower facet, and a second connecting curved surface connecting the second lower facet and the second upper facet.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
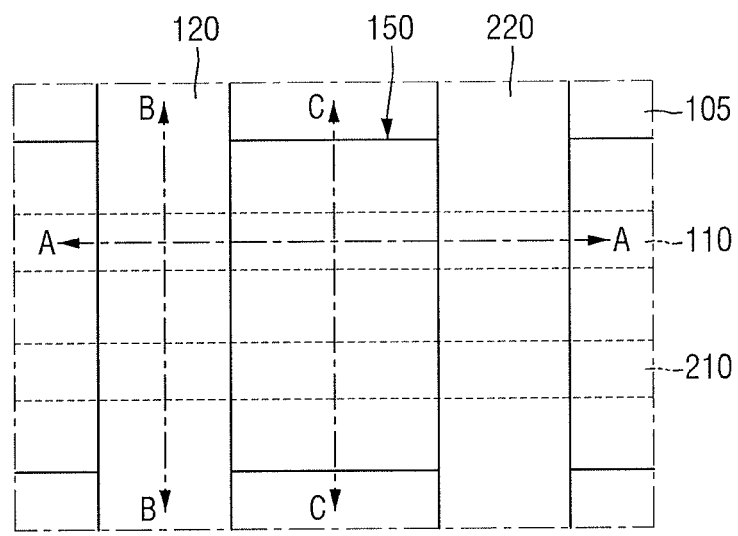
FIG. 1 illustrates a plan view for explaining a semiconductor device according to some embodiments.
Figure 1:
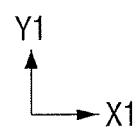

In the drawings of the semiconductor device according to some embodiments, a fin-type transistor (FinFET) including a channel region of a pin-like pattern shape is illustrated. However, embodiments are not limited thereto. It is needless to say that the semiconductor device according to some embodiments may include a tunneling transistor (FET), a transistor including a nanowire, a transistor including a nanosheet, or a three-dimensional (3D) transistor. In addition, the semiconductor device according to some embodiments may include a bipolar junction transistor, a lateral double diffusion transistor (LDMOS), and the like.

Figure 2:
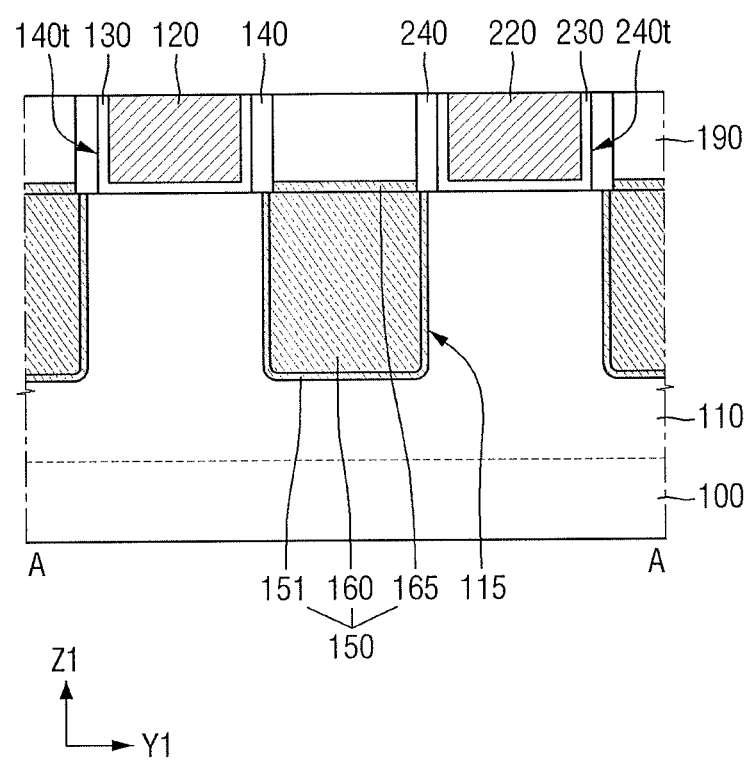
FIGS. 2 to 4 illustrate cross-sectional views taken along lines A-A, B-B and C-C of FIG. 1, respectively.
Figure 3:
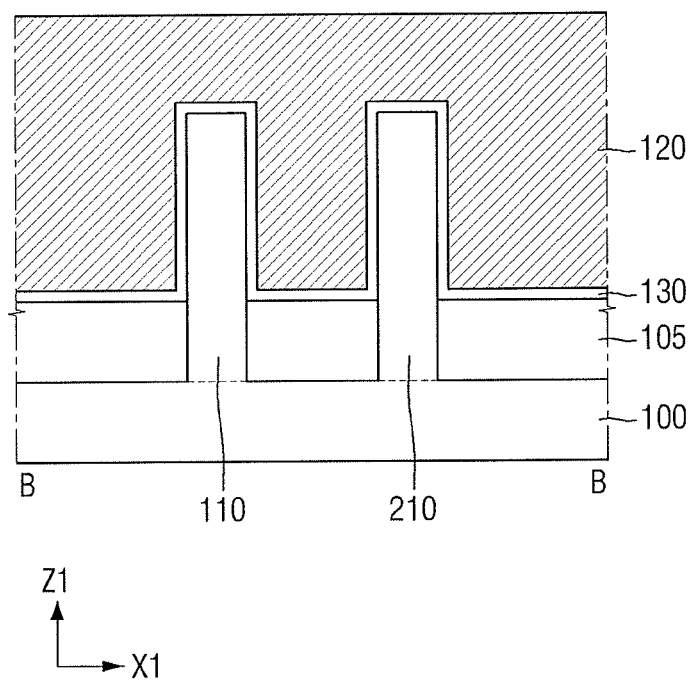
Figure 4:
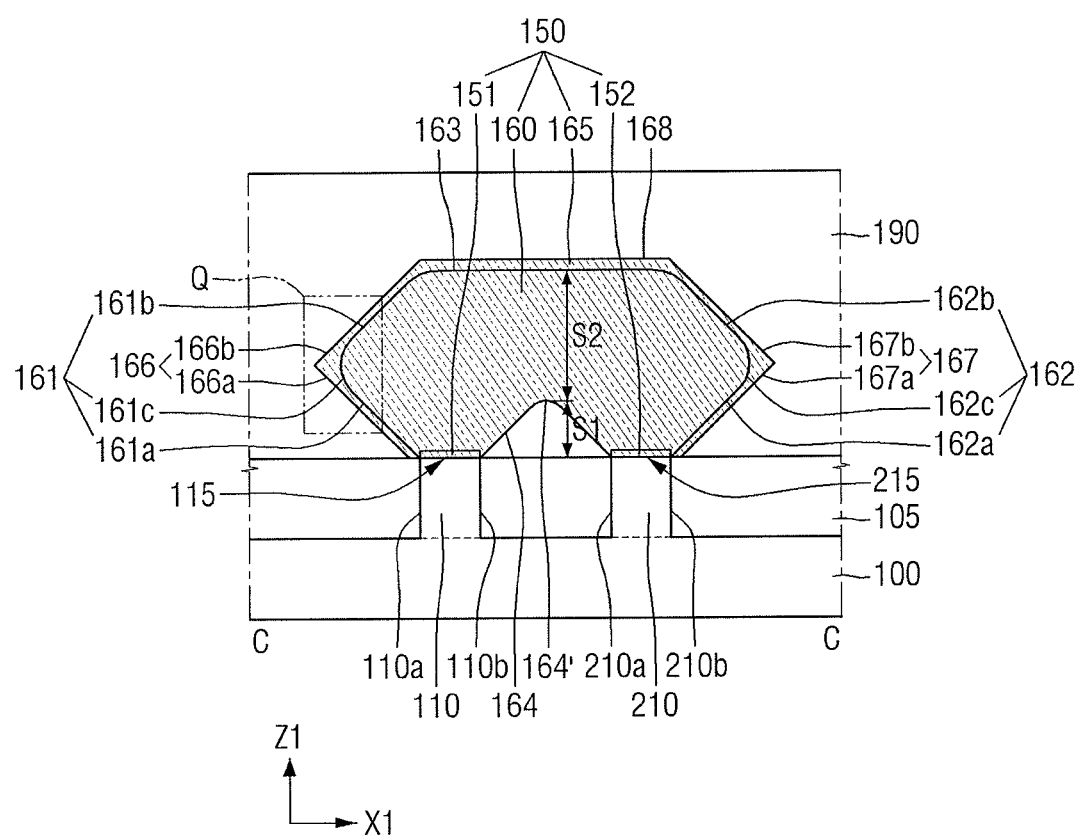
Figure 5:
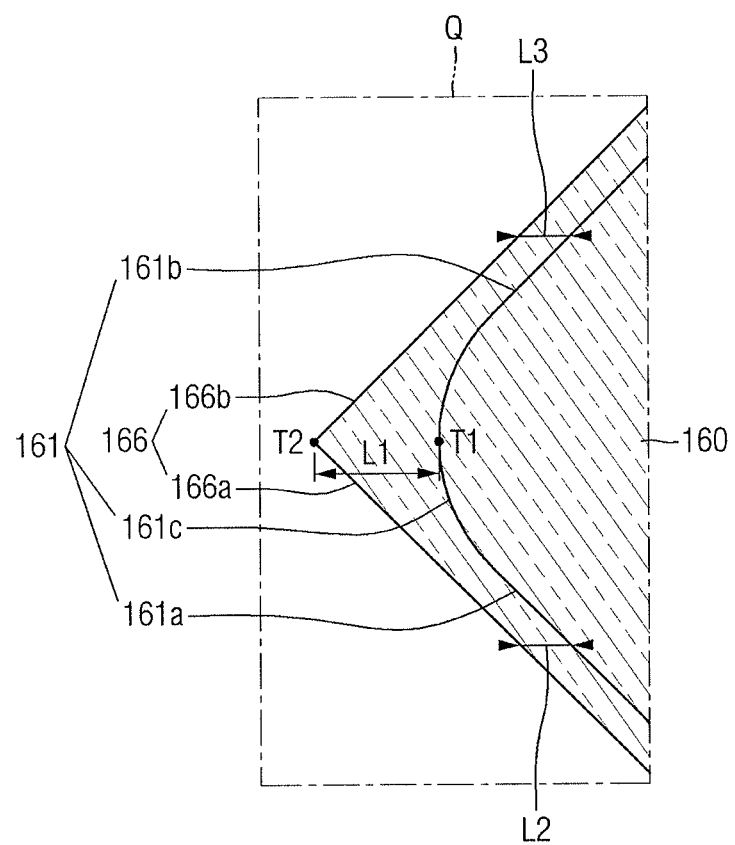
FIG. 5 illustrates an enlarged view of a part Q of FIG. 4.

FIG. 1 is a plan view for explaining a semiconductor device according to some embodiments. FIGS. 2 to 4 are cross-sectional views taken along lines A-A, B-B and C-C of FIG. 1, respectively. FIG. 5 is an enlarged view of a part Q of FIG. 4. For convenience of explanation, FIG. 1 illustrates only a first fin type pattern 110, a second fin type pattern 210, a first gate electrode 120, a second gate electrode 220, and a first epitaxial pattern 150.

Referring to FIGS. 1 to 5, the semiconductor device according to some embodiments may include the first fin type pattern 110, the second fin type pattern 210, the first gate electrode 120, the second gate electrode 220, and the first epitaxial pattern 150.

The substrate 100 may be a bulk substrate or a silicon-on-insulator (SOI). Alternatively, the substrate 100 may be a silicon substrate, and may contain other materials, for example, silicon germanium, silicon germanium on insulator (SGOI), indium antimonide, lead telluride, indium arsenide, indium phosphorous, gallium arsenide, or gallium antimonide.

The first fin type pattern 110 may extend long along the first direction X1 on the substrate 100. The first fin type pattern 110 may protrude from the substrate 100. The first fin type pattern 110 may include a first sidewall 110a and a second sidewall 110b facing each other along the first direction Y1. The second fin type pattern 210 may extend long along the first direction X1 on the substrate 100, e.g., may be parallel to the first fin type pattern 110. The second fin type pattern 210 may protrude from the substrate 100. The second fin type pattern 210 may include a first sidewall 210a and a second sidewall 210b facing each other along the second direction Y1.

The first fin type pattern 110 and the second fin type pattern 210 may be formed to be adjacent to and spaced apart from each other along the second direction Y1. The first fin type pattern 110 and the second fin type pattern 210 may be formed side by side. For example, the first fin type pattern 110 and the second fin type pattern 210 may be arranged in the second direction Y1. For example, the first fin type pattern 110 and the second fin type pattern 210 may include a long side extending in the first direction X1, and a short side extending in the second direction Y1, respectively. The long side of the first fin type pattern 110 and the long side of the second fin type pattern 210 may face each other.

The first fin type pattern 110 and the second fin type pattern 210 may be a part of the substrate 100, and may include an epitaxial layer that is grown from the substrate 100. The first fin type pattern 110 and the second fin type pattern 210 may include, for example, silicon or germanium, which is an elemental semiconductor material. Further, the first fin type pattern 110 and the second fin type pattern 210 may contain compound semiconductors, and may contain, for example, a group IV-IV compound semiconductor or a group III-V compound semiconductor.

Taking the group IV-IV compound semiconductor as an example, the first fin type pattern 110 and the second fin type pattern 210 may be a binary compound or a ternary compound containing at least two or more of carbon (C), silicon (Si), germanium (Ge), and tin (Sn), or a compound obtained by doping these elements with the group IV elements.

Taking the group III-V compound semiconductor as an example, the first fin type pattern 110 and the second fin type pattern 210 may be one of a binary compound, a ternary compound or a quaternary compound formed by combining at least one of aluminum (Al), gallium (Ga), and indium (In) as the group III elements and one of phosphorous (P), arsenic (As), and antimonium (Sb) as the group V elements.

In the semiconductor device according to some embodiments, the first fin type pattern 110 and the second fin type pattern 210 are illustrated as being silicon fin type patterns including silicon.

In the semiconductor device described with reference to FIGS. 1 to 5, the first fin type pattern 110 and the second fin type pattern 210 may include a channel region of the same type of transistor. For example, the first fin type pattern 110 and the second fin type pattern 210 may be used as a channel region of the PMOS transistor.

The field insulating film 105 may be formed on the substrate 100. The field insulating film 105 may cover a part of the first fin type pattern 110 and a part of the second fin type pattern 210. For example, the field insulating film 105 may cover a part of the sidewall of the first fin type pattern 110 and a part of the sidewall of the second fin type pattern 210.

The upper surface of the first fin type pattern 110 and the upper surface of the second fin type pattern 210 may protrude upward from the upper surface of the field insulating film 105 formed between the long side of the first fin type pattern 110 and the long side of the second fin type pattern 210. In particular, the first and second fin type patterns 110 and 210 may extend further along the third direction Z1 from the substrate 100 such that the upper surfaces thereof are further from the substrate 100 than the upper surface of the field insulating film 105. The first fin type pattern 110 and the second fin type pattern 210 may be defined by the field insulating film 105 on the substrate 100. In other words, the field insulating film 105 may extend between the first fin type pattern 110 and the second fin type pattern 210.

The field insulating film 105 may include at least one of a silicon oxide film, a silicon nitride film, and a silicon oxynitride film. Further, the field insulating film 105 may further include at least one more field liner films formed between the first fin type pattern 110 and the field insulating film 105, and between the second fin type pattern 210 and the field insulating film 105. When the field insulating film 105 further includes the field liner film, the field liner film may contain at least one of polysilicon, amorphous silicon, silicon oxynitride, silicon nitride, and silicon oxide.

The first gate electrode 120 may extend along the second direction Y1 and may intersect the first fin type pattern 110, the second fin type pattern 210, and the second fin type pattern 210. The first gate electrode 120 may be on the first fin type pattern 110, the second fin type pattern 210, and the field insulating film 105. The second gate electrode 220 may extend along the second direction Y1 and may intersect the first fin type pattern 110, the second fin type pattern 210, and the second fin type pattern 210. The second gate electrode 220 may be on the first fin type pattern 110, the second fin type pattern 210, and the field insulating film 105.

The second gate electrode 220 may be formed in parallel with the first gate electrode 120. The first gate electrode 120 and the second gate electrode 220 may be spaced apart from each other along the first direction X1. The first gate electrode 120 and the second gate electrode 220 may have a same configuration and may wrap the first fin type pattern 110 and the second fin type pattern 210 protruding upward from the upper surface of the field insulating film 105, respectively (FIG. 3 illustrating the first gate electrode 120). In other words, the first gate electrode 120 and the second gate electrode 220 may both cover sidewalls and upper surfaces of portions of the first fin type pattern 110 and the second fin type pattern 210 respectively protruding upward from the upper surface of the field insulating film 105.

The first gate electrode 120 and the second gate electrode 220 may contain at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (MoC), titanium (Ti), tantalum (Ta, nickel (Ni), platinum (Pt), nickel platinum (Ni—Pt), niobium (Nb, niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. The first gate electrode 120 and the second gate electrode 220 may each contain a conductive metal oxide, a conductive metal oxynitride, and the like, and may contain the oxidized form of the above-mentioned substances.

The first gate electrode 120 and the second gate electrode 220 may be formed, but are not limited to, through a replacement process or a gate last process.

The first gate spacer 140 may be formed on the sidewall of the first gate electrode 120. The first gate spacer 140 may define a first gate trench 140*t*. A second gate spacer 240 may be formed on the sidewall of the second gate electrode 220. The second gate spacer 240 may define a second gate trench 240*t*. The first gate spacer 140 and the second gate spacer 240 may contain, for example, at least one of silicon nitride (SiN), silicon oxynitride (SiON), silicon oxide (SiO2, silicon oxycarbonitride (SiOCN) and combinations thereof. The first and second gate spacers 140 and 240 are illustrated as a single film, respectively, but are not limited thereto, and may, of course, have a structure of multiple films.

The first gate insulating film 130 may be formed between the first fin type pattern 110 and the first gate electrode 120, and between the second fin type pattern 210 and the first gate electrode 120. The first gate insulating film 130 may be formed along a profile of the first fin type pattern 110 and a profile of the second fin type pattern 210 protruding upward from the field insulating film 105. The first gate insulating film 130 may be formed along the sidewalls and bottom surface of the first gate trench 140*t*. The first gate insulating film 130 may be formed between the first gate spacer 140 and the first gate electrode 120.

The second gate insulating film 230 may be formed between the first fin type pattern 110 and the second gate electrode 220, and between the second fin type pattern 210 and the second gate electrode 220. The second gate insulating film 230 may be formed along the profile of the first fin type pattern 110 and the profile of the second fin type pattern 210 protruding upward from the field insulating film 105. The second gate insulating film 230 may be formed along the sidewalls and the bottom surface of the second gate trench 240*t*. The second gate insulating film 230 may be formed between the second gate spacer 240 and the second gate electrode 220.

Unlike the configuration illustrated in FIG. 2, an interfacial layer may be between the first gate insulating film 130 and the first fin type pattern 110, and between the second gate insulating film 230 and the first fin type pattern 110, respectively. Further, unlike the configuration illustrated in FIG. 3, an interlayer layer may be between the first gate insulating film 130 and the first fin type pattern 110, and between the first gate insulating film 130 and the second fin type pattern 210, respectively.

If the first fin type pattern 110 and the fin type of the second fin type pattern 210 are silicon fin type patterns, an interface layer may include, e.g., a silicon oxide. Depending on the material included in the first fin type pattern 110 and the second fin type pattern 210, the interface layer may vary.

The first gate insulating film 130 and the second gate insulating film 230 may include a high dielectric material having a dielectric constant higher than that of the silicon oxide film. For example, the first gate insulating film 130 and the second gate insulating film 230 may include at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum, or lead zinc niobate.

Each of a first recess 115 and a second recess 215 may be formed along the first direction Y1 between the first gate electrode 120 and the second gate electrode 220, and below the first gate electrode 120 and the second gate electrode 220 along the third direction Z1, e.g., closer to the substrate 100. For example, a first sidewall of the first recess 115 or a second recess 215 may be directly below the first gate spacer 140 and a second sidewall of the first recess 115 or a second recess 215, connected along the second direction Y1 by a bottom surface of the first recess 115 or a second recess 215, may be directly below the second gate spacer 240. In other words, respective side walls of the first recess 115 or a second recess 215 may overlap one of the first gate spacer 140 and the second gate spacer 240. The first recess 115 may be formed in the first fin type pattern 110 and the second recess 215 may be formed in the second fin type pattern 210.

In FIG. 4, a point at which the first fin type pattern 110 and the second fin type pattern 210 intersect the upper surface of the field insulating film 105, the bottom surface of the first recess 115 and the bottom surface of the second recess 215 are illustrated as being located at the same height along the third direction Z1 as the upper surface of the field insulating film 105. However, embodiments are not limited thereto. It is a matter of course that the bottom surface of the first recess 115 and the bottom surface of the second recess 215 may be closer to the substrate 100 than the upper surface of the field insulating film 105.

The first epitaxial pattern 150 may be formed on the first fin type pattern 110 and the second fin type pattern 210 between the first gate electrode 120 and the second gate electrode 220. A part of the first epitaxial pattern 150 may be formed in each of the first recess 115 and the second recess 215. The first epitaxial pattern 150 may be formed through an epitaxial growth process.

The first epitaxial pattern 150 may be included in a source/drain of a transistor which uses the first fin type pattern 110 and the second fin type pattern 210 as a channel region. For example, the first epitaxial pattern 150 may be included in a merged source/drain of a transistor including a plurality of channel regions. Since the first fin type pattern 110 and the second fin type pattern 210 may be used as the channel region of the PMOS transistor, the first epitaxial pattern 150 may be included in the source/drain of the PMOS transistor.

The first epitaxial pattern 150 may include a compressive stress material. For example, the compressive stress material may be a material having a larger lattice constant than that of Si, e.g., SiGe. For example, the compressive stress material may improve mobility of the carrier in the channel region, by applying compressive stress to the first fin type pattern 110 and the second fin type pattern 210.

The first epitaxial pattern 150 may include a doped p-type dopant. The first epitaxial pattern 150 may include, for example, at least one of B, In, Ga, and Al. Further, in some cases, the first epitaxial pattern 150 may contain carbon (C) to prevent the p-type impurity from diffusing into the channel region.

The first epitaxial pattern 150 may include a first seed film 151, a second seed film 152, a first shared semiconductor pattern 160, and a first capping semiconductor pattern 165.

The first seed film 151 may be formed on the first fin type pattern 110 and the second seed film 152 may be formed on the second fin type pattern 210. For example, the first seed film 151 may be formed along the first recess 115 and the second seed film 152 may be formed along the second recess 215. The first seed film 151 and the second seed film 152 may be spaced apart from each other along the second direction Y1, e.g., corresponding to a spacing between the first fin type pattern 110 and the second fin type pattern 210.

The first seed film 151 and the second seed film 152 may serve as a seed for epitaxial growth. Each of the first seed film 151 and the second seed film 152 may contain a compound semiconductor, and may contain, e.g., silicon germanium. As an example, the first seed film 151 and the second seed film 152 may contain a p-type impurity.

The first shared semiconductor pattern 160 may be formed on the first fin type pattern 110 and the second fin type pattern 210. The first shared semiconductor pattern 160 may be formed on the first seed film 151 and the second seed film 152.

The first shared semiconductor pattern 160 may be formed over the first fin type pattern 110 and the second fin type pattern 210. The first shared semiconductor pattern 160 may connect the first fin type pattern 110 and the second fin type pattern 210. A first part of the first shared semiconductor pattern 160 may be the first recess 115, a second part of the first shared semiconductor pattern 160 may be in the second recess 215, and a third part, e.g., a remaining part, of the first shared semiconductor pattern 160 may be on the upper surface of the field insulating film 105. In FIG. 2, the upper surface of the first shared semiconductor pattern 160 and the upper surface of the first fin type pattern 110 are illustrated as being coplanar, for convenience of explanation, and embodiments are not limited thereto.

The first shared semiconductor pattern 160 may include a compound semiconductor material, and may include, e.g., silicon germanium. For example, the fraction of germanium of the first shared semiconductor pattern 160 may be larger than the fraction of germanium in either of the first seed film 151 and the second seed film 152. When the first shared semiconductor pattern 160, the first seed film 151, and the second seed film 152 contain p-type impurities, the concentration of the p-type impurity contained in the first shared semiconductor pattern 160 may be higher than the concentration of the p-type impurity contained in either of the first seed film 151 and the second seed film 152.

The first shared semiconductor pattern 160 may include a first sidewall 161, a second sidewall 162, an upper surface 163, and a bottom surface 164.

The first sidewall 161 of the first shared semiconductor pattern may be adjacent to the first fin type pattern 110. The first sidewall 161 of the first shared semiconductor pattern may be adjacent to the first sidewall 110a of the first fin type pattern. The second sidewall 162 of the first shared semiconductor pattern may be adjacent to the second fin type pattern 210. The second sidewall 162 of the first shared semiconductor pattern may be adjacent to the second sidewall 210b of the second fin type pattern. The first sidewall 161 of the first shared semiconductor pattern and the second sidewall 162 of the first shared semiconductor pattern may extend in a direction away from the upper surface of the substrate 100 along the third direction Z1.

The first sidewall 161 of the first shared semiconductor pattern 160 may include a first lower inner facet 161a, a first upper inner facet 161b on the first lower inner facet 161a, and a first connecting inner curved surface 161c which connects the first lower inner facet 161a and the first upper inner facet 161b. The second sidewall 162 of the first shared semiconductor pattern 160 may include a second lower inner facet 162a, a second upper inner facet 162b on the second lower inner facet 162a, and a second connecting inner curved surface 162c which connects the second lower inner facet 162a and the second upper inner facet 162b. In this particular example, the first lower inner facet 161a and the first upper inner facet 161b are linear and join the first connecting inner curved surface 161c where their linearity ends. Similarly, the second lower inner facet 162a and the first upper inner facet 162b are linear and join the first connecting inner curved surface 162c where their linearity ends.

In particular, the first lower inner facet 161a may extend away from the upper surface of the substrate 100 along the third direction Z1 and away from the first sidewall 110a and the bottom surface 164 along the second direction Y1. The first upper inner facet 161b may extend away from the upper surface of the substrate 100 along the third direction Z1 and back towards the first sidewall 110a along the second direction Y1. Similarly, the second lower inner facet 162a may extend away from the upper surface of the substrate 100 along the third direction Z1 and away from the second sidewall 210b and the bottom surface 164 along the second direction Y1. The second upper inner facet 162b may extend away from the upper surface of the substrate 100 along the third direction Z1 and back towards the second sidewall 210b along the second direction Y1. In particular, all of the facets may extend at an oblique angle with respect to the upper surface of the substrate 100.

For example, each of the first lower inner facet 161a, the first upper inner facet 161b, the second lower inner facet 162a, and the second upper inner facet 162b may be included in a group of {111} crystal planes. Each of the first lower inner facet 161a, the first upper inner facet 161b, the second lower inner facet 162a, and the second upper inner facet 162b may be one of the crystal planes included in the group of {111} crystal planes.

The upper surface 163 of the first shared semiconductor pattern may connect the first sidewall 161 of the first shared semiconductor pattern 160 and the second sidewall 162 of the first shared semiconductor pattern 160. Here, the term "upper surface" may refer to the plane which connects the point at which the first upper inner facet 161b terminates, e.g., where its linearity ends, and the point at which the second upper inner facet 162b terminates, e.g., where its linearity ends.

In FIG. 4, the upper surface 163 of the first shared semiconductor pattern is illustrated as being convex upward, e.g., the connection between where the termination points of the first sidewall 161 of the first shared semiconductor pattern 160 and the second sidewall 162 of the first shared semiconductor pattern 160 may be convex upward, but is not limited thereto. Otherwise, the upper surface 163 may be linear and extend along the first direction X1.

The bottom surface 164 of the first shared semiconductor pattern may be formed between the second sidewall 110b of the first fin type pattern and the first sidewall 210a of the second fin type pattern. The bottom surface 164 of the first shared semiconductor pattern may have a concave shape relative to the first shared semiconductor pattern 160, e.g., may extend upwards along the third direction Z1 from the substrate 100 at an oblique angle with respect to the upper surface of the substrate 100. An air gap may be formed between the bottom surface 164 of the first shared semiconductor pattern and the upper surface of the field insulating film 105, but embodiments are not limited thereto. If the air gap is formed, the air gap may contain air as well as the process gases or the like used in the manufacturing process of the semiconductor device. Further, a height S1 along the third direction Z1 from the upper surface of the field insulating film 105, e.g., from the lowest point of the bottom surface, to a highest point 164' of the bottom surface 164 may be less than a height S2 along the third direction Z1 from highest point 164' of the bottom surface 164 to the portion of the upper surface 163 overlapping the highest point 164' of the bottom surface 164 along the third direction Z1. The curvature of the bottom surface 164 may be continuous.

The first capping semiconductor pattern 165 may be formed on the first shared semiconductor pattern 160. The first capping semiconductor pattern 165 may extend along the first sidewall 161 of the first shared semiconductor pattern 160, the upper surface 163 of the first shared semiconductor pattern 160, and the second sidewall 162 of the first shared semiconductor pattern 160. The first capping semiconductor pattern 165 may include an elemental semiconductor material, e.g., silicon. The first capping semiconductor pattern 165 may include a first sidewall 166, a second sidewall 167, and an upper surface 168.

The first sidewall 166 of the first capping semiconductor pattern 165 may be located on the first sidewall 161 of the first shared semiconductor pattern 160. The first sidewall 166 of the first capping semiconductor pattern 165 may correspond to the first sidewall 161 of the first shared semiconductor pattern 160. The second sidewall 167 of the first capping semiconductor pattern 165 may be located on the second sidewall 162 of the first shared semiconductor pattern 160. The second sidewall 167 of the first capping semiconductor pattern 165 may correspond to the second sidewall 162 of the first shared semiconductor pattern 160.

The first sidewall 166 of the first capping semiconductor pattern 165 may include a first lower outer facet 166a and a first upper outer facet 166b on the first lower outer facet 166a. The first lower outer facet 166a may be aligned with the first lower inner facet 161a and the first upper outer facet 166b may be aligned with the first upper inner facet 161b.

The second sidewall 167 of the first capping semiconductor pattern 165 may include a second lower outer facet 167a and a second upper outer facet 167b on the second lower outer facet 167a. The second lower outer facet 167a may be aligned with the second lower inner facet 162a and the second upper outer facet 167b may be aligned with the second upper inner facet 162b.

In the semiconductor device according to some embodiments, the first lower outer facet 166a may be directly connected to the first upper outer facet 166b, and the second lower outer facet 167a may be directly connected to the second upper outer facet 167b.

Each of the first lower outer facet 166a, the first upper outer facet 166b, the second lower outer facet 167a, and the second upper outer facet 167b may be included in a group of {111} crystal planes. Each of the first lower outer facet 166a, the first upper outer facet 166b, the second lower outer facet 167a, and the second upper outer facet 167b may be one of the crystal planes included in the group of {111} crystal planes.

The upper surface 168 of the first capping semiconductor pattern may connect the first sidewall 166 of the first capping semiconductor pattern to the second sidewall 167 of the first capping semiconductor pattern. For example, the upper surface 168 of the first capping semiconductor pattern may be parallel with the upper surface of the substrate 100.

In FIGS. 4 and 5, the first sidewall 161 of the first shared semiconductor pattern may include a first tip T1 and the first sidewall 166 of the first capping semiconductor pattern may include a second tip T2. Here, the term "tip" may refer to a point located farthest from the first sidewall 110a of the first fin type pattern in the second direction Y1 among the first sidewall 161 of the first shared semiconductor pattern 160 and the first sidewall 166 of the first capping semiconductor pattern 165.

In the semiconductor device according to some embodiments, the first tip T1 of the first sidewall 161 of the first shared semiconductor pattern may be located on the first connecting inner curved surface 161c. The second tip T2 of the first sidewall 166 of the first capping semiconductor pattern may be a point at which the first lower outer facet 166a and the first upper outer facet 166b are connected to each other.

For example, a distance L1 between the first tip T1 of the first sidewall 161 of the first shared semiconductor pattern 160 and the second tip T2 of the first sidewall 166 of the first capping semiconductor pattern 165 is greater than a distance L2 between the first lower inner facet 161a and the first lower outer facet 166a. The distance L1 between the first tip T1 of the first sidewall 161 of the first shared semiconductor pattern 160 and the second tip T2 of the first sidewall 166 of the first capping semiconductor 165 pattern is greater than the distance L3 between the first upper inner facet 161b and the first upper outer facet 166b. Here, the term "distance between facets" may refer to the distance between points at which a virtual plane parallel to the upper surface of the substrate 100 intersects with the inner facet and the outer facet.

Further, the width of at least a part of the first capping semiconductor pattern 165 formed on the first sidewall 161 of the first shared semiconductor pattern gradually increases as it goes away from the substrate 100, and then, the width may gradually decrease. That is, the first capping semiconductor pattern 165 may include a portion that gradually increases in width as it goes away from the substrate 100 and gradually decreases. Here, the term "width" may refer to the width of the portion in which the virtual plane parallel to the upper surface of the substrate 100 intersects with the first capping semiconductor pattern 165. In other words, the distance between at least a part of the first sidewall 161 of the first shared semiconductor pattern 160 and at least a part of the first sidewall 166 of the first capping semiconductor pattern 165 may gradually increase further from the substrate 100 until the first tip T1 and the second tip T2 are reached, and then may gradually decrease further from the substrate 100.

Of course, the shape and positional relations between the second sidewall 162 of the first shared semiconductor pattern 160 and the second sidewall 167 of the first capping semiconductor pattern 165 may also be explained as described above.

The first interlayer insulating film 190 may be formed on the first epitaxial pattern 150. The first interlayer insulating film 190 may surround the sidewalls of the first gate spacer 140 and the second gate spacer 240. The first interlayer insulating film 190 may include, e.g., at least one of silicon oxide, silicon nitride, and silicon oxynitride.

Figure 6:
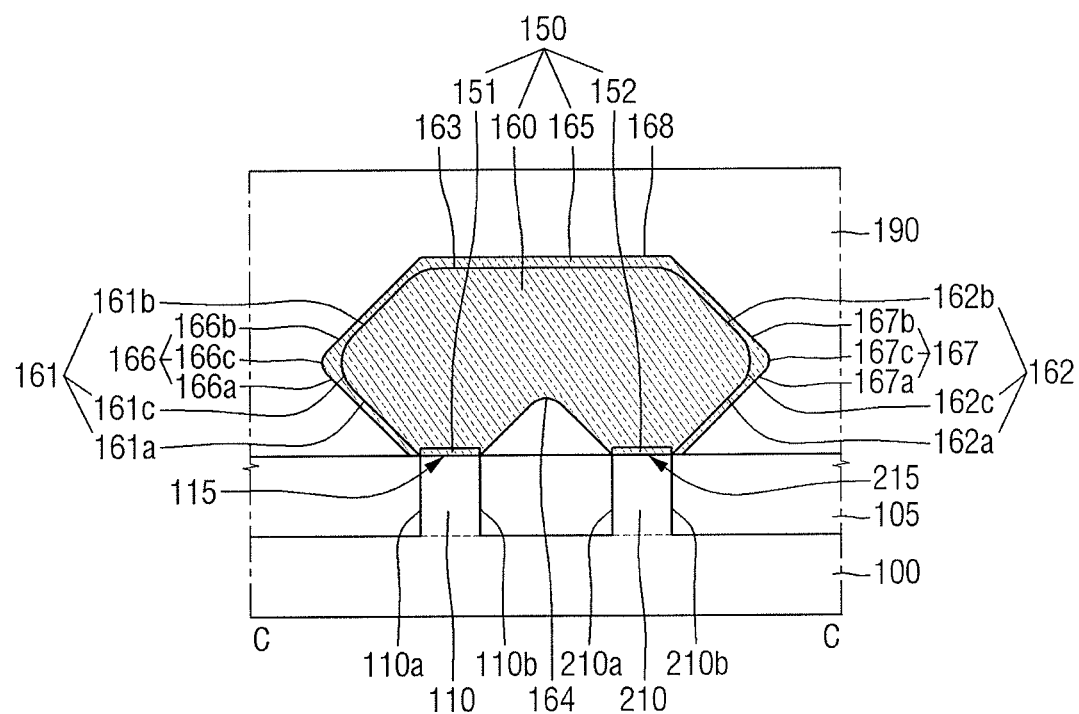
FIG. 6 illustrates a diagram for explaining the semiconductor device according to some embodiments.

FIG. 6 is a diagram for explaining the semiconductor device according to some embodiments. For the sake of convenience of explanation, differences from those described with reference to FIGS. 1 to 5 will be mainly described. Referring to FIG. 6, in the semiconductor device according to some embodiments, the first capping semiconductor pattern 165 may include a first connecting outer curved surface 166c, and a second connecting outer curved surface 167c.

The first connecting outer curved surface 166c may correspond to the first connecting inner curved surface 161c, and the second connecting outer curved surface 167c may correspond to the second connecting inner curved surface 162c. The first connecting outer curved surface 166c may connect the first lower outer facet 166a and the first upper outer facet 166b. The second connecting outer curved surface 167c may connect the second lower outer facet 167a and the second upper outer facet 167b.

The second tip (T2 in FIG. 5) included in the first sidewall 166 of the first capping semiconductor pattern may be located on the first connecting outer curved surface 166c. In other words, the distance between at least a part of the first sidewall 161 of the first shared semiconductor pattern 160 and at least a part of the first sidewall 166 of the first capping semiconductor pattern 165 may gradually increase further from the substrate 100 until the first connecting outer curved surface 166c and the second connecting outer curved surface 167c are reached, and then may gradually decrease further from the substrate 100.

Figure 7:
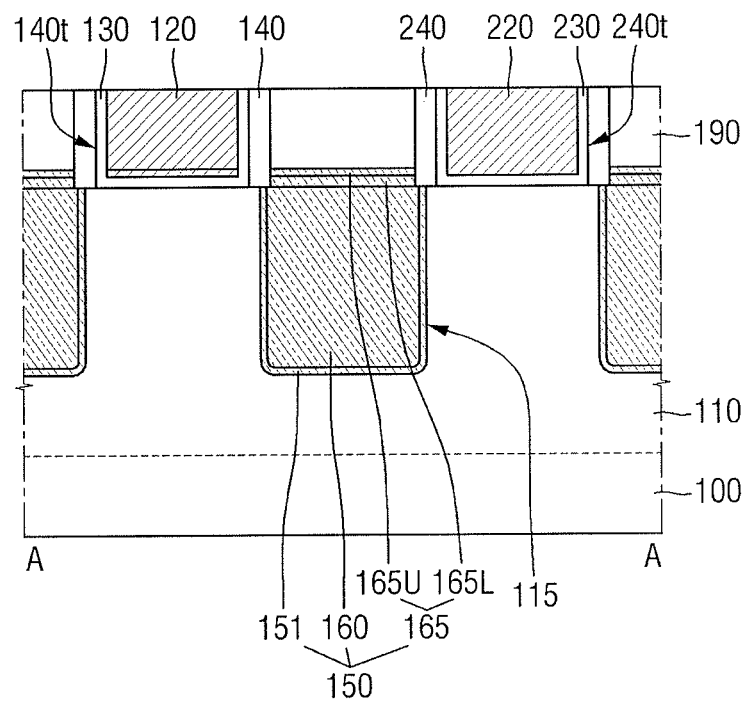
FIGS. 7 and 8 illustrate diagrams for explaining the semiconductor device according to some embodiments.
Figure 8:
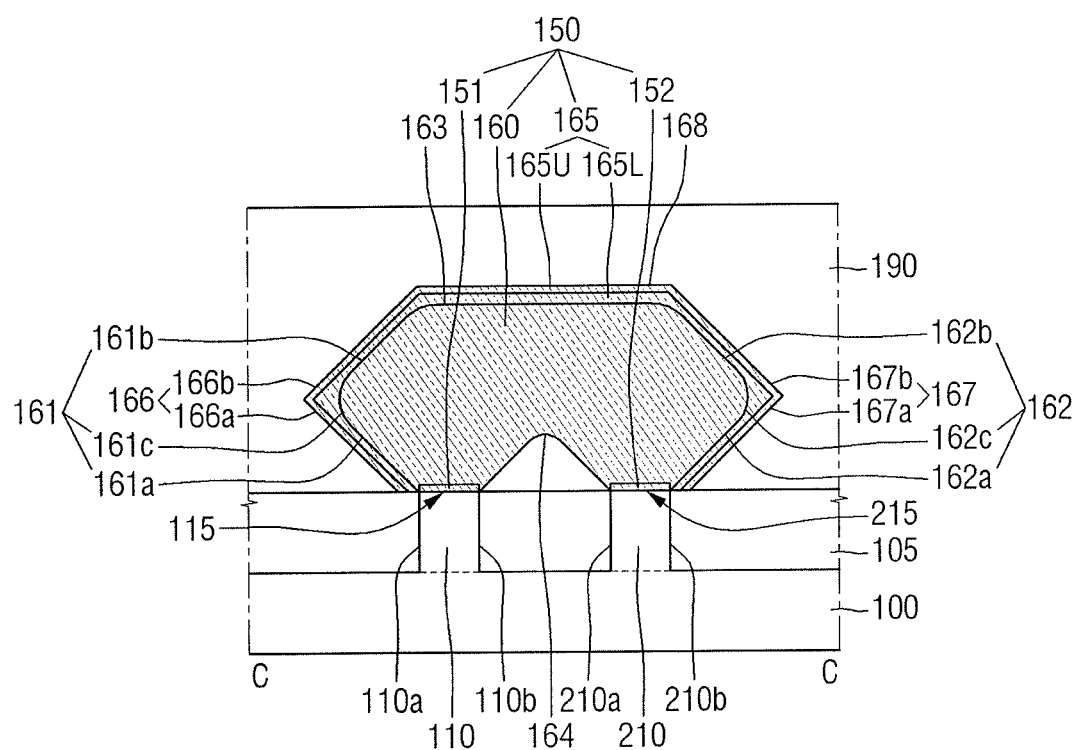

FIGS. 7 and 8 are diagrams for explaining the semiconductor device according to some embodiments. For the sake of convenience of explanation, differences from those described with reference to FIGS. 1 to 5 will be mainly described. Referring to FIGS. 7 and 8, in the semiconductor device according to some embodiments, the first capping semiconductor pattern 165 may include a lower capping semiconductor pattern 165L and an upper capping semiconductor pattern 165U sequentially formed on the first shared semiconductor pattern 160.

The lower capping semiconductor pattern 165L may extend along the first sidewall 161 of the first shared semiconductor pattern, the upper surface 163 of the first shared semiconductor pattern, and the second sidewall 162 of the first shared semiconductor pattern. The upper capping semiconductor pattern 165U may be formed along the lower capping semiconductor pattern 165L.

The lower capping semiconductor pattern 165L may contain a compound semiconductor material, and may include, e.g., silicon germanium. As an example, the fraction of germanium of the lower capping semiconductor pattern 165L may be greater than the fraction of germanium of the first shared semiconductor pattern 160. As another example, even if the fraction of germanium of the lower capping semiconductor pattern 165L is the same as the fraction of germanium of the first shared semiconductor pattern 160, the concentration of the p-type impurity contained in the lower capping semiconductor pattern 165L may be different from the concentration of p-type impurity contained in the first shared semiconductor pattern 160. The upper capping semiconductor pattern 165U may contain an elemental semiconductor material, and may include, e.g., silicon.

Figure 9:
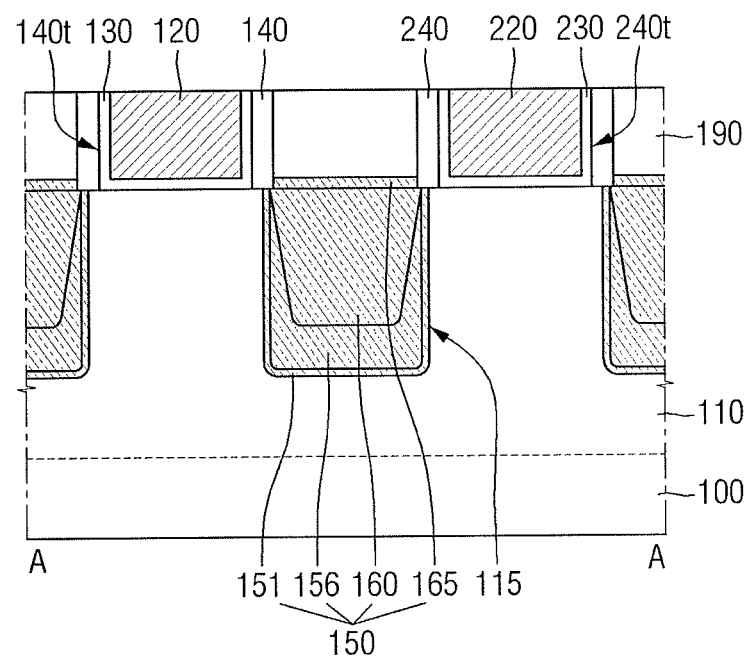
FIGS. 9 and 10 illustrate diagrams for explaining the semiconductor device according to some embodiments.
Figure 10:
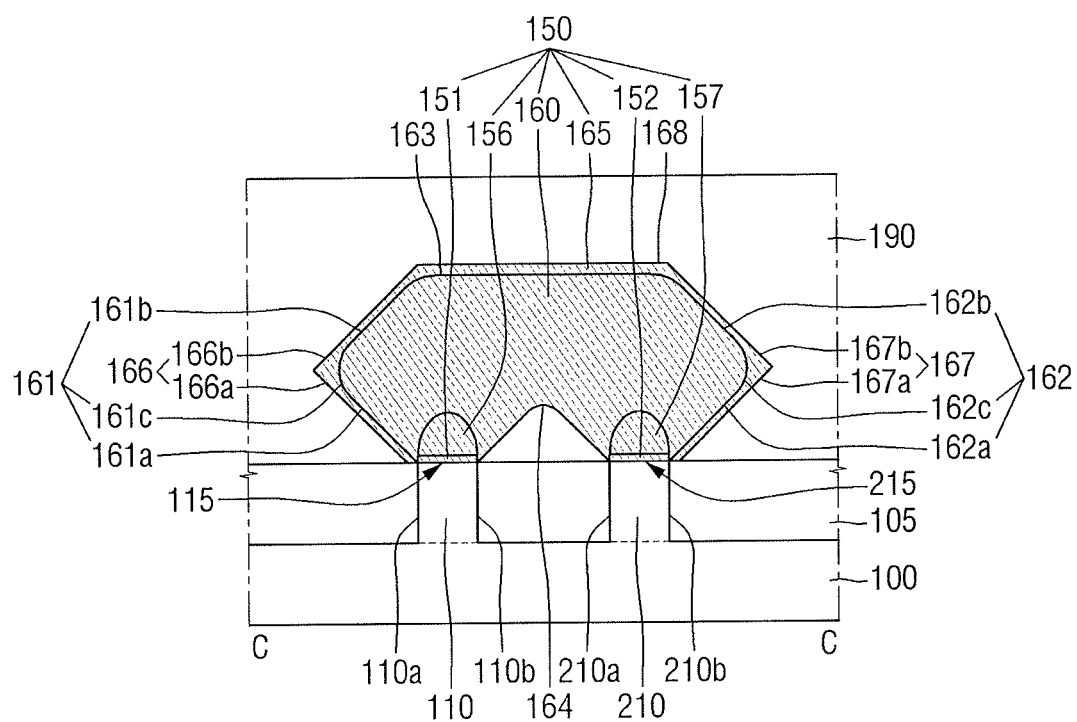

FIGS. 9 and 10 are diagrams for explaining the semiconductor device according to some embodiments. For the sake of convenience of explanation, differences from those described with reference to FIGS. 1 to 5 will be mainly described. Referring to FIGS. 9 and 10, in the semiconductor device according to some embodiments, the first epitaxial pattern 150 may include a first lower semiconductor pattern 156, and a second lower semiconductor pattern 157.

The first lower semiconductor pattern 156 may be formed on the first seed film 151. For example, the first lower semiconductor pattern 156 may be formed along the first recess 115. The second lower semiconductor pattern 157 may be formed on the second seed film 152. For example, the second lower semiconductor pattern 157 may be formed along the second recess 215. The first lower semiconductor pattern 156 and the second lower semiconductor pattern 157 may be spaced apart from each other. The first shared semiconductor pattern 160 may be formed on the first lower semiconductor pattern 156 and the second lower semiconductor pattern 157. The first lower semiconductor pattern 156 and the second lower semiconductor pattern 157 may extend along the third direction Z1 away from the substrate 100 into the first shared semiconductor pattern 160. Upper surfaces of the first lower semiconductor pattern 156 and the second lower semiconductor pattern 157 may be convex.

Each of the first lower semiconductor pattern 156 and the second lower semiconductor pattern 157 may include compound semiconductor materials, and may contain, e.g., silicon germanium. For example, the germanium fraction of the first lower semiconductor pattern 156 may be greater than the germanium fraction of the first seed film 151 and may be smaller than the germanium fraction of the first shared semiconductor pattern 160. For example, when the first shared semiconductor pattern 160, the first lower semiconductor pattern 156, and the first seed film 151 contain p-type impurities, the concentration of the p-type impurities included in the first lower semiconductor pattern 156 may be higher than the concentration of the p-type impurities contained in the first seed film 151 and may be lower than the concentration of the p-type impurities contained in the first shared semiconductor pattern 160.

Figure 11:
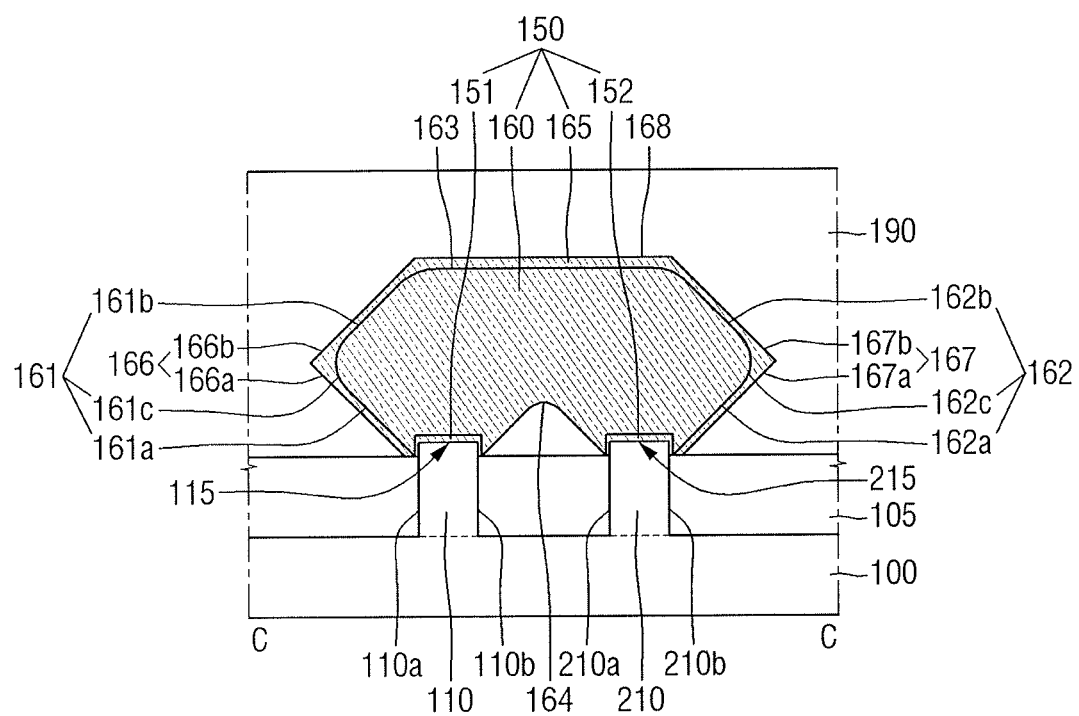
FIGS. 11 and 12 illustrate diagrams for explaining the semiconductor device according to some embodiments, respectively.

FIG. 11 is a diagram for explaining a semiconductor device according to some embodiments, respectively. For the sake of convenience of explanation, differences from those described with reference to FIGS. 1 to 5 will be mainly described.

Referring to FIG. 11, in the semiconductor device according to some embodiments, a part of the sidewalls 110a and 110b of the first fin type pattern and the sidewalls 210a and 210b of the second fin type pattern may protrude upward from the upper surface of the field insulating film 105.

Where the first fin type pattern 110 and the second fin type pattern 210 intersect with the upper surface of the field insulating film 105, the bottom surface of the first recess 115 and the bottom surface of the second recess 215 may be higher than the upper surface of field insulating film 105 along the third direction Z1.

The first seed film 151 is formed on the first fin type pattern 110 protruding upward from the upper surface of the field insulating film 105, and the second seed film 152 may be formed on the first fin type pattern 110 protruding upward from the upper surface of the field insulating film 105. In FIG. 11, the first seed film 151 may also formed on the sidewalls 110a and 110b of the first fin type pattern protruding from the upper surface of the field insulating film 105, and the second seed film 152 is also formed on the sidewalls 210a and 210b of the second fin type pattern protruding from the upper surface of the field insulating film 105, but the embodiments are not limited thereto.

Figure 12:
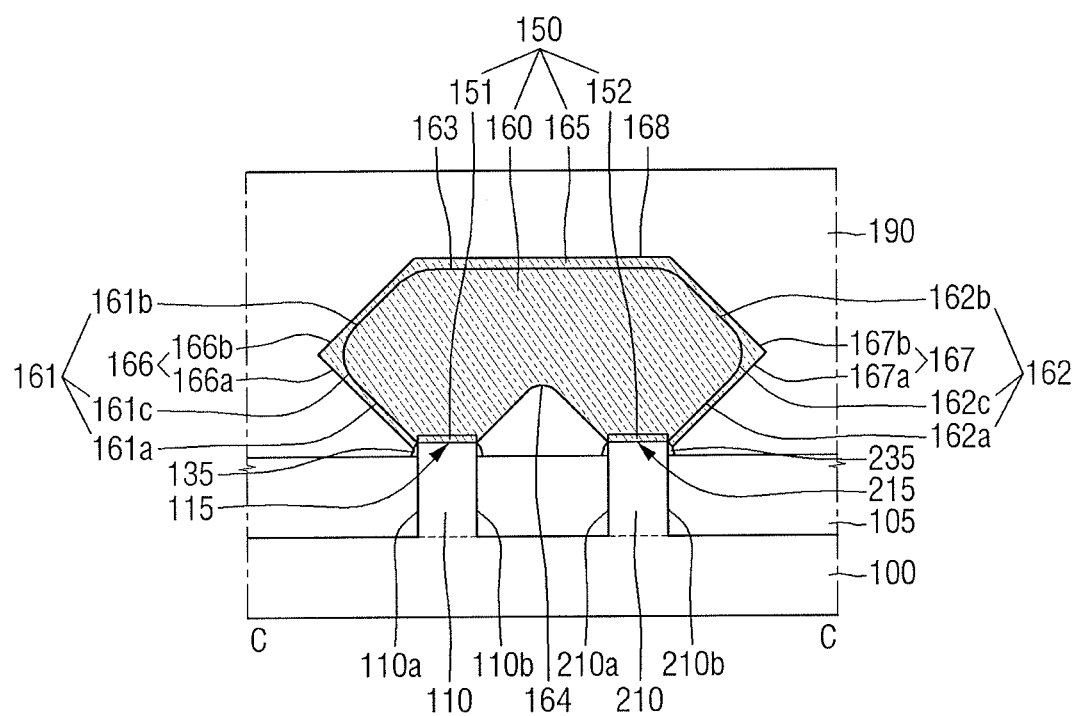

FIG. 12 is a diagram for explaining a semiconductor device according to some embodiments, respectively. For the sake of convenience of explanation, differences from those described with reference to FIGS. 1 to 5 will be mainly described. Referring to FIG. 12, the semiconductor device according to some embodiments may further include a first fin spacer 135 formed along a part of the sidewalls 110a and 110b of the first fin type pattern, and a second fin spacer 235 formed along a part of the sidewalls 210a and 210b of the second fin type pattern.

The first fin spacer 135 and the second fin spacer 235 may be formed on the field insulating film 105. The first fin spacer 135 may be formed on the sidewalls 110a and 110b of the first fin type pattern protruding upward from the upper surface of the field insulating film 105. The second fin spacer 235 may be formed on the sidewalls 210a and 210b of the second fin type pattern protruding upward from the upper surface of the field insulating film 105. The first and second fin spacers 135 and 235 may include, for example, at least one of silicon nitride (SiN), silicon oxynitride (SiON), silicon oxide (SiO2), silicon oxycarbonitride (SiOCN), and combinations thereof. The first fin spacer 135 and the second fin spacer 235 may include the same material as the first gate spacer 140 and the second gate spacer 240.

Figure 13:
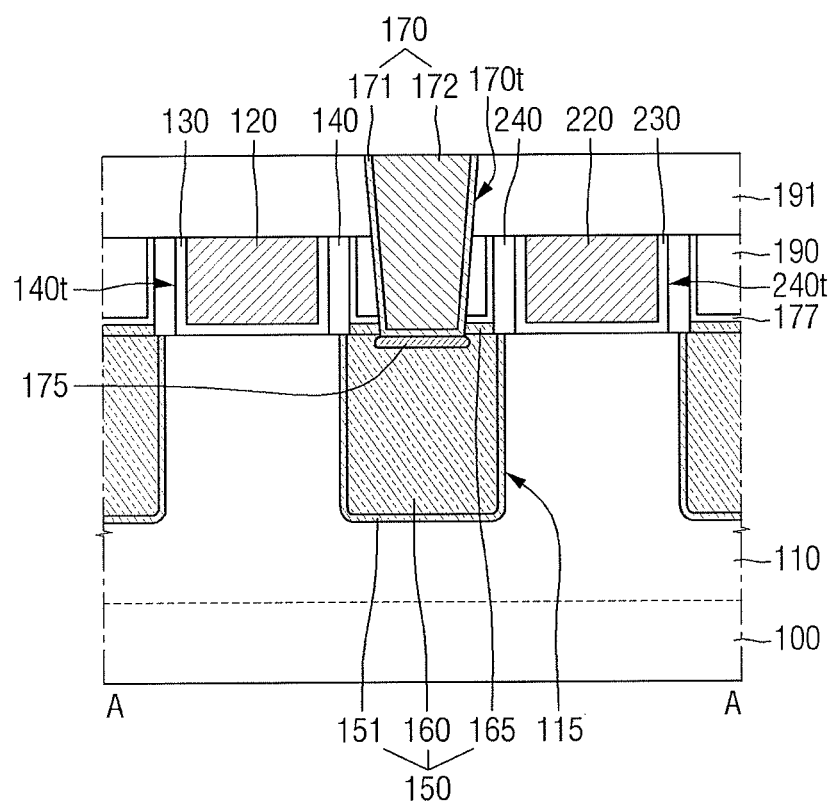
FIGS. 13 and 14 illustrate diagrams for explaining the semiconductor device according to some embodiments.
Figure 14:
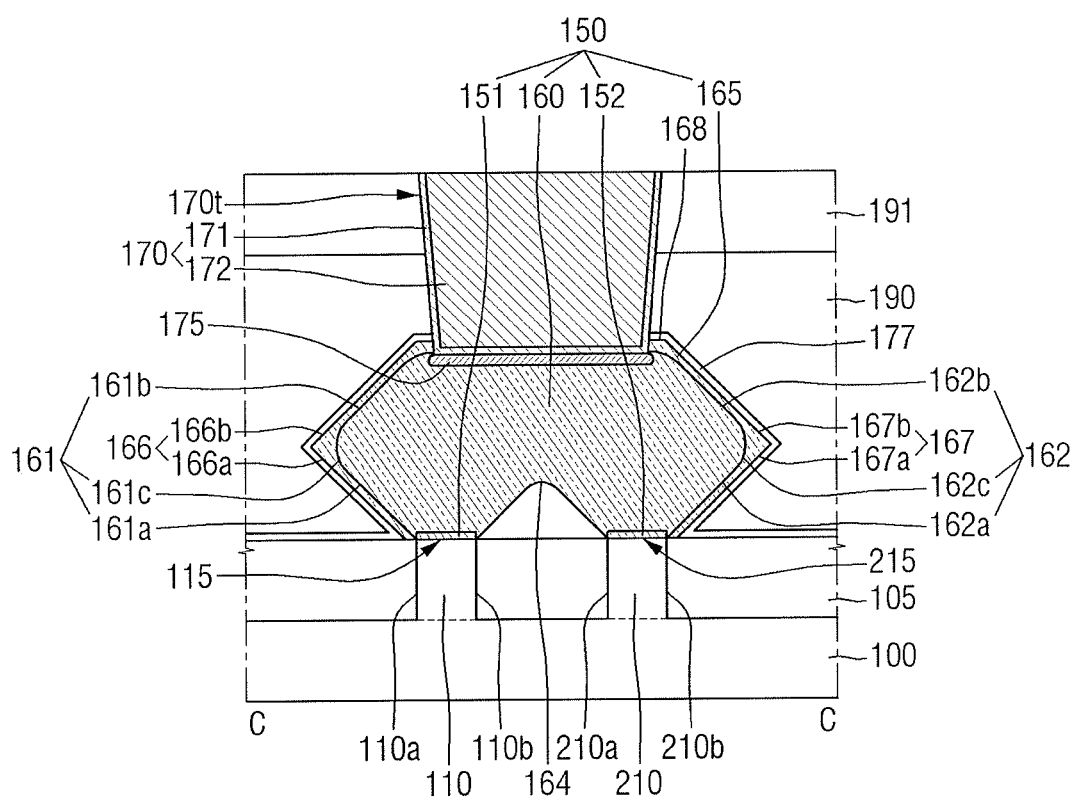

FIGS. 13 and 14 are diagrams for explaining the semiconductor device according to some embodiments. For the sake of convenience of explanation, differences from those described with reference to FIGS. 1 to 5 will be mainly described. Referring to FIGS. 13 and 14, the semiconductor device according to some embodiments may further include a silicide film 175, and a contact 170 connected the first epitaxial pattern 150 on the silicide film 175.

An etching stop film 177 may be formed on the first epitaxial pattern 150. The etching stop film 177 is formed along the first sidewall 166 of the first capping semiconductor pattern, the second sidewall 167 of the first capping semiconductor pattern, and the upper surface 168 of the first capping semiconductor pattern. The etching stop film 177 may be formed along the upper surface of the field insulating film 105. The etching stop film 177 may include an insulating material having an etching selectivity with respect to the first interlayer insulating film 190. The second interlayer insulating film 191 is formed on the first interlayer insulating film 190, the first gate electrode 120, and the second gate electrode 220. Unlike the illustrated configuration, the etching stop film 177 may not be formed on the first epitaxial pattern 150.

A contact hole 170t may be formed in the first interlayer insulating film 190 and the second interlayer insulating film 191. The contact hole 170t may also be formed to pass through the etching stop film 177. The contact hole 170t may expose at least a part of the first epitaxial pattern 150. For example, the contact hole 170t may expose the first shared semiconductor pattern 160.

The silicide film 175 may be formed on the first epitaxial pattern 150. For example, the silicide film 175 may be formed on the first shared semiconductor pattern 160. The silicide film 175 may be formed on the bottom surface of the contact hole 170t. For example, the silicide film 175 may generally be in contact with the first epitaxial pattern 150.

The contact 170 may be formed in the contact hole 170t. The contact 170 may be formed on the silicide film 175. The contact 170 may include a barrier conductive film 171 extending along the sidewalls and the bottom surface of the contact hole 170t, and a filling conductive film 172 which fills the contact hole 170t on the barrier conductive film 171.

Figure 15:
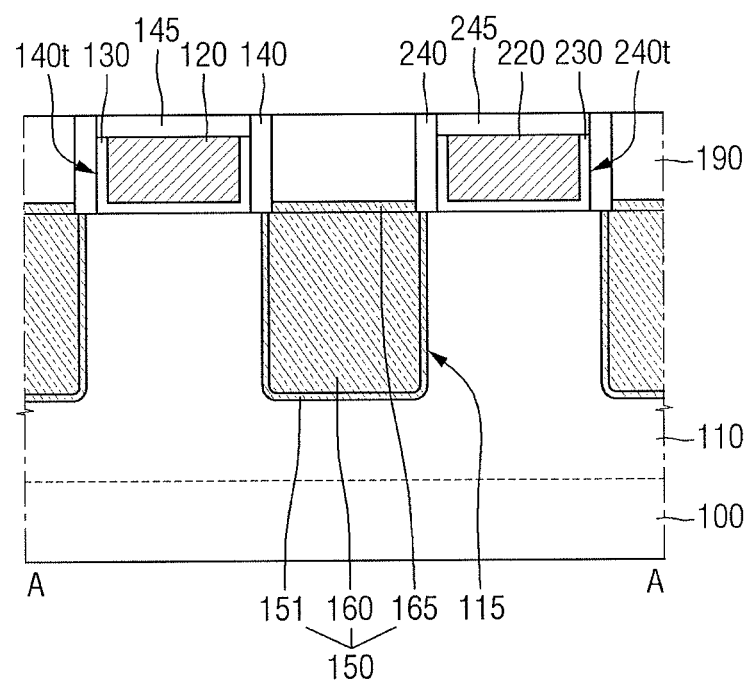
FIG. 15 illustrates a diagram for explaining the semiconductor device according to some embodiments.

FIG. 15 is a diagram for explaining a semiconductor device according to some embodiments. For the sake of convenience of explanation, differences from those described with reference to FIGS. 1 to 5 will be mainly described. Referring to FIG. 15, the semiconductor device according to some embodiments may further include a first capping pattern 145 and a second capping pattern 245.

The first gate electrode 120 may fill a part of the first gate trench 140t. The first capping pattern 145 may be formed on the first gate electrode 120. The first capping pattern 145 may fill the remaining portion of the first gate trench 140t which is left after the first gate electrode 120 is formed. The second gate electrode 220 may fill a part of the second gate trench 240t. The second capping pattern 245 may be formed on the second gate electrode 220. The second capping pattern 245 may fill the remaining portion of the second gate trench 240t which is left after the second gate electrode 220 is formed.

In FIG. 15, the first gate insulating film 130 is not formed between the first gate spacer 140 and the first capping pattern 145, and the second gate insulating film 230 is not formed between the second gate spacer 240 and the second capping pattern 245, it is for convenience of explanation and is not limited thereto.

Each of the upper surface of the first capping pattern 145 and the upper surface of the second capping pattern 245 may be placed on the same plane as the upper surface of the first interlayer insulating film 190. For example, the first capping pattern 145 and the second capping pattern 245 may include a material having an etching selectivity of the first interlayer insulating film 190. The first capping pattern 145 and the second capping pattern 245 may include, for example, at least one of silicon nitride (SiN), silicon oxynitride (SiON), silicon oxide (SiO2), silicon carbonitride (SiCN), silicon oxycarbonitride (SiOCN), and combinations thereof.

Figure 16:
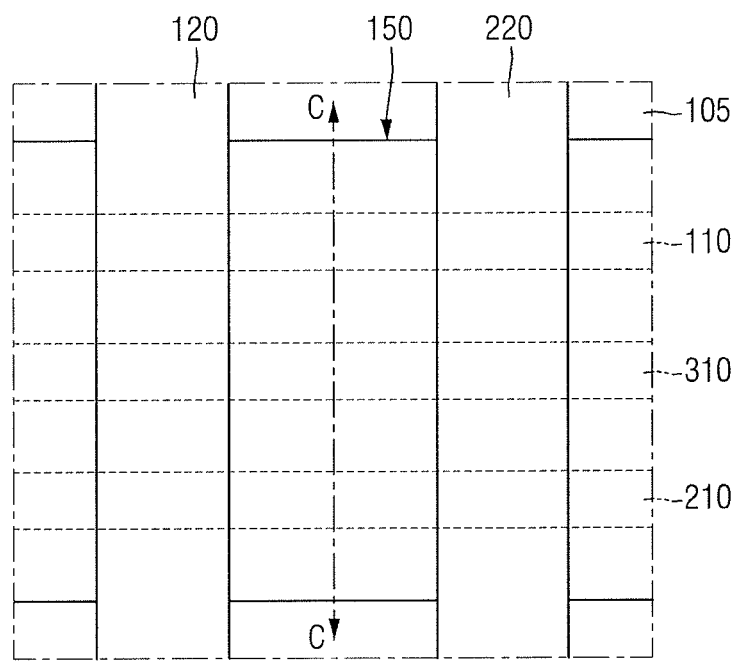
FIGS. 16 and 17 illustrate diagrams for explaining the semiconductor device according to some embodiments.
Figure 17:
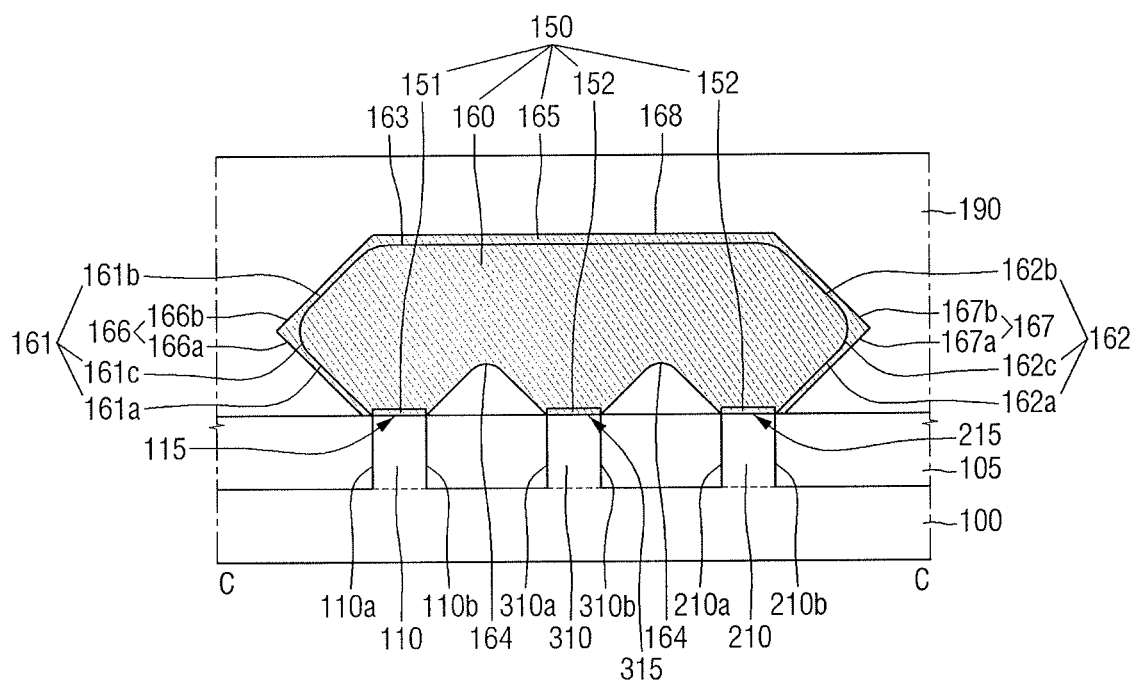

FIGS. 16 and 17 are diagrams for explaining the semiconductor device according to some embodiments. For the sake of convenience of explanation, differences from those described with reference to FIGS. 1 to 5 will be mainly described. Referring to FIGS. 16 and 17, the semiconductor device according to some embodiments may further include a third fin type pattern 310.

The third fin type pattern 310 may extend along the first direction X1 on the substrate 100. The third fin type pattern 310 may protrude from the substrate 100 along the third direction Z1. The third fin type pattern 310 may include a first sidewall 310a and a second sidewall 310b that face each other. The third fin type pattern 310 may be disposed between the first fin type pattern 110 and the second fin type pattern 210. The first gate electrode 120 and the second gate electrode 220 may intersect the third fin type pattern 310, respectively.

The third recess 315 may be formed between the first gate electrode 120 and the second gate electrode 220. The third recess 315 may be formed in the third fin type pattern 310.

The first epitaxial pattern 150 may be formed on the first to third fin type patterns 110, 210, and 310. The first epitaxial pattern 150 may further include a third seed film 153. The third seed film 153 may be formed on the second fin type pattern 210 and may be formed in the third recess 315.

The first shared semiconductor pattern 160 may be formed to extend from the first fin type pattern 110 to the second fin type pattern 210. The first shared semiconductor pattern 160 may be formed on the third fin type pattern 310 on which the third seed film 153 is formed.

The bottom surface 164 of the first shared semiconductor pattern may be formed between the second sidewall 110b of the first fin type pattern and the first sidewall 310a of the third fin type pattern, and between the first sidewall 210a of the second fin type pattern and the second sidewall 310b of the third fin type pattern.

Figure 18:
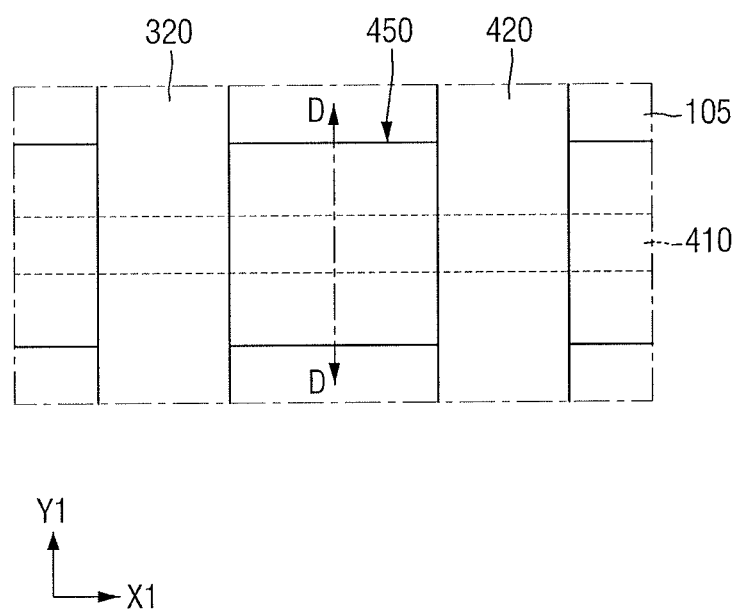
FIGS. 18 and 19 illustrate diagrams for explaining the semiconductor device according to some embodiments.
Figure 19:
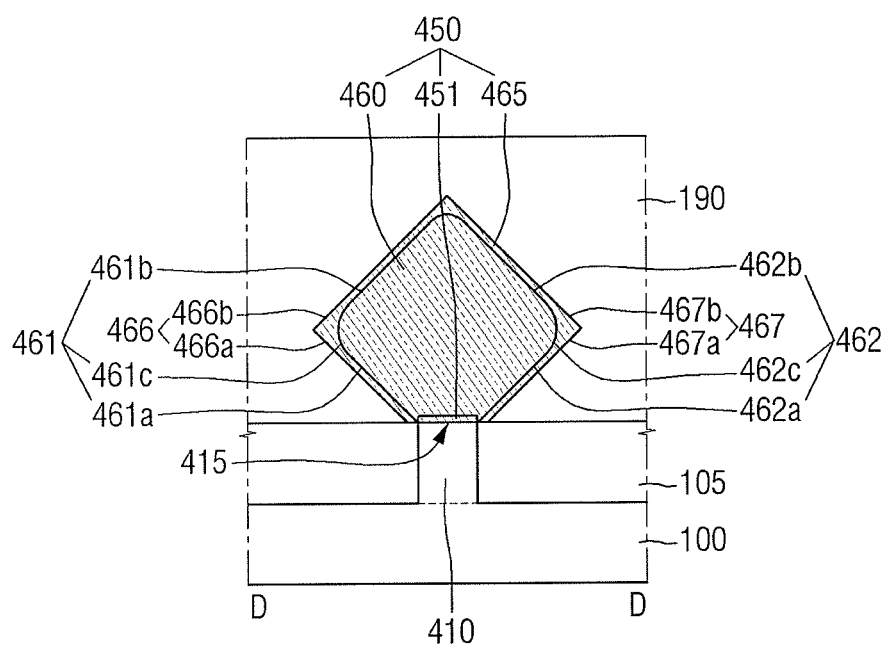

FIGS. 18 and 19 are diagrams for explaining the semiconductor device according to some embodiments. For convenience of explanation, FIG. 18 illustrates only a fourth fin type pattern 410, a third gate electrode 320, a fourth gate electrode 420, and a second epitaxial pattern 450. Referring to FIGS. 18 and 19, the semiconductor device according to some embodiments may include the fourth fin type pattern 410, the third gate electrode 320, the fourth gate electrode 420, and the second epitaxial pattern 450.

The fourth fin type pattern 410 may extend long along the first direction X1 on the substrate 100. The fourth fin type pattern 410 may protrude from the substrate 100. A part of the sidewall of the fourth fin type pattern 410 may be covered with the field insulating film 105. The fourth fin type pattern 410 may be used as a channel region of a PMOS transistor. The explanation of the fourth fin type pattern 410 may be similar to those of the first and second fin type patterns 110 and 210.

Each of the third gate electrode 320 and the fourth gate electrode 420 may be formed to extend in the second direction Y1 and intersect with the fourth fin type pattern 410. The explanation of the third gate electrode 320 and the fourth gate electrode 420 may be similar to those of the first gate electrode 120 and the second gate electrode 220.

The fourth recess 415 may be formed between the third gate electrode 320 and the fourth gate electrode 420. The fourth recess 415 may be formed in the fourth fin type pattern 410.

The second epitaxial pattern 450 may be formed on the fourth fin type pattern 410 between the third gate electrode 320 and the fourth gate electrode 420. The second epitaxial pattern 450 may be formed through an epitaxial growth process. The second epitaxial pattern 450 may include a fourth seed film 451, a second shared semiconductor pattern 460, and a second capping semiconductor pattern 465.

The fourth seed film 451 may be formed on the fourth fin type pattern 410. The fourth seed film 451 may include, for example, silicon germanium. The second shared semiconductor pattern 460 may be formed on the fourth fin type pattern 410 on which the fourth seed film 451 is formed. The second shared semiconductor pattern 460 may include, for example, silicon germanium. The fraction of germanium in the second shared semiconductor pattern 460 may be greater than the fraction of germanium in the fourth seed film 451.

The second shared semiconductor pattern 460 may include a first sidewall 461 and a second sidewall 462. The first sidewall 461 of the second shared semiconductor pattern may include a third lower inner facet 461a, a third upper inner facet 461b on the third lower inner facet 461a, and a third connecting inner curved surface 461c which connects the third lower inner facet 461a and the third upper inner facet 461b. The second sidewall 462 of the second shared semiconductor pattern may include a fourth lower inner facet 462a, a fourth upper inner facet 462b on the fourth lower inner facet 462a, and a fourth connecting inner curved surface 462c which connects the fourth lower inner facet 462a and the fourth upper inner facet 462b.

The second capping semiconductor pattern 465 may be formed on the second shared semiconductor pattern 460. The second capping semiconductor pattern 465 may extend along the first sidewall 461 of the second shared semiconductor pattern and the second sidewall 462 of the second shared semiconductor pattern. The second capping semiconductor pattern 465 may include, for example, silicon. In some cases, the second capping semiconductor pattern 465 may include an upper film and a lower film as described in FIGS. 7 and 8.

The second capping semiconductor pattern 465 may include a first sidewall 466 and a second sidewall 467. The first sidewall 466 of the second capping semiconductor pattern may correspond to the first sidewall 461 of the second shared semiconductor pattern. The second sidewall 467 of the second capping semiconductor pattern may correspond to the second sidewall 462 of the second shared semiconductor pattern.

The first sidewall 466 of the second capping semiconductor pattern may include a third lower outer facet 466a, and a third upper outer facet 466b directly connected to the third lower outer facet 466a. The third lower outer facet 466a may be aligned with the third lower inner facet 461a, and the third upper outer facet 466b may be aligned with the third upper inner facet 461b. The second sidewall 467 of the second capping semiconductor pattern may include a fourth lower outer facet 467a, and a fourth upper outer facet 467b directly connected to the fourth lower outer facet 467a. The fourth lower outer facet 467a may be aligned with the fourth lower inner facet 462a, and the fourth upper outer facet 467b may be aligned with the fourth upper inner facet 462b.

The third lower inner facet 461a, the third upper inner facet 461b, the fourth lower inner facet 462a, the fourth upper inner facet 462b, the third lower outer facet 466a, the third upper outer facet 466b, the fourth lower outer facet 467a, and the fourth upper outer facet 467b may each be one of the crystal planes included in the group of {111} crystal planes.

Figure 20:
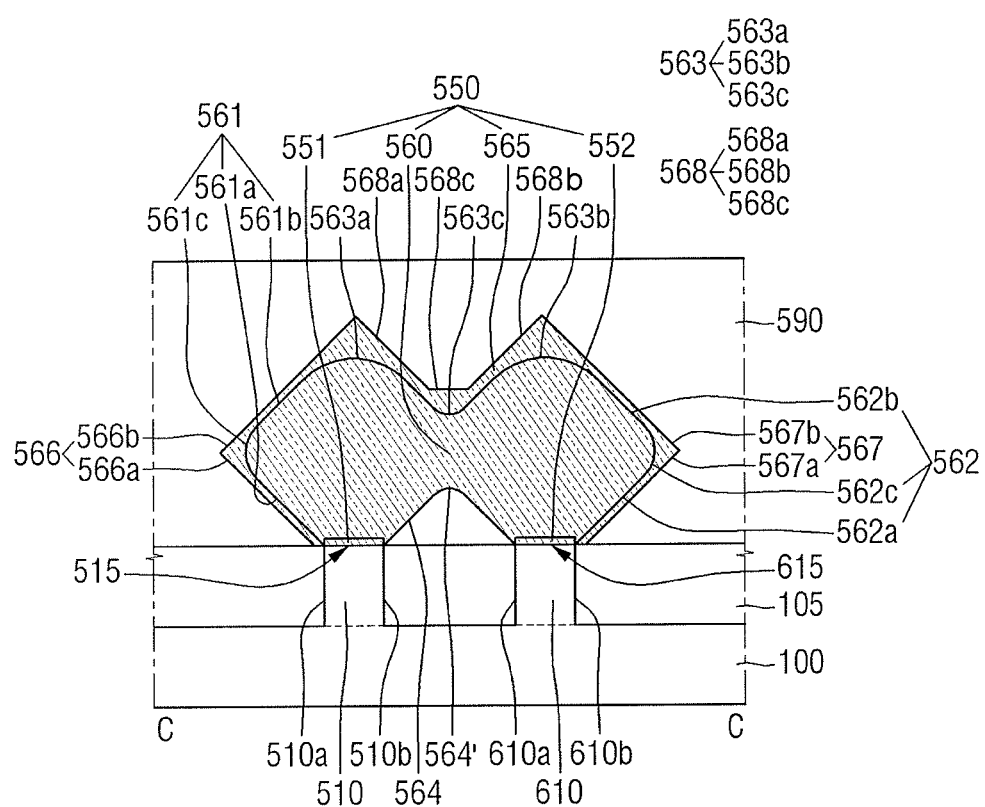
FIG. 20 illustrates a diagram for explaining the semiconductor device according to some embodiments.

FIG. 20 is a diagram for explaining a semiconductor device according to some embodiments, respectively. For the sake of convenience of explanation, differences from those described with reference to FIGS. 1 to 5 will be mainly described. Referring to FIG. 20, the semiconductor device according to some embodiments may include a fifth fin type pattern 510, a sixth fin type pattern 610, a fifth gate electrode 520, a sixth gate electrode 620, and the third epitaxial pattern 550.

The fifth fin type pattern 510 and the sixth fin type pattern 610 may extend along the first direction X1 and may be spaced apart along the second direction Y1. The fifth fin type pattern 510 includes a first sidewall 510a and a second sidewall 510b opposite to each other along the second direction Y1, and the sixth fin type pattern 610 includes a first sidewall 610a and a second sidewall 610b facing each other, along the second direction Y1.

The fifth gate electrode 520 and the sixth gate electrode 620 may extend in the second direction Y1. The fifth gate electrode 520 and the sixth gate electrode 620 may intersect both the fifth fin type pattern 510 and the sixth fin type pattern 610, respectively.

The fifth recess 515 and the sixth recess 615 may be formed between the fifth gate electrode 520 and the sixth gate electrode 620, respectively. The fifth recess 515 may be formed in the fifth fin type pattern 510 and the sixth recess 615 may be formed in the sixth fin type pattern 610. The third epitaxial pattern 550 is formed on the fifth fin type pattern 510 and the sixth fin type pattern 610 between the fifth gate electrode 520 and the sixth gate electrode 620 It can be done. A portion of the third epitaxial pattern 550 may be formed in each of the fifth recess 515 and the sixth recess 615.

The third epitaxial pattern 550 may include a fifth seed film 551, a sixth seed film 552, a third shared semiconductor pattern 560, and a third capping semiconductor pattern 565. The fifth seed film 551 may be formed on the fifth fin type pattern 510 and the sixth seed film 552 may be formed on the sixth fin type pattern 610. The fifth seed film 551 and the sixth seed film 552 can include, for example, silicon germanium.

The third shared semiconductor pattern 560 may be formed on the fifth fin type pattern 510 and the sixth fin type pattern 610. The third shared semiconductor pattern 560 may be formed on the fifth seed film 551 and the sixth seed film 552. The third shared semiconductor pattern 560 may be formed over the fifth fin type pattern 510 and the sixth fin type pattern 610. The third shared semiconductor pattern 560 may include, for example, silicon germanium. The third shared semiconductor pattern 560 may include a first sidewall 561, a second sidewall 562, an upper surface 563, and a bottom surface 564.

The first sidewall 561 of the third shared semiconductor pattern 560 is adjacent to the first sidewall 510a of the fifth fin type pattern 510 and the second sidewall 562 of the third shared semiconductor pattern 560 is adjacent to the second sidewall 610b of the sixth fin type pattern 610. The first sidewall 561 of the third shared semiconductor pattern includes a fifth lower inner facet 561a, a fifth upper inner facet 561b on the fifth lower inner facets 561a, and a fifth connecting inner curved surface 561c connecting the fifth lower inner facets 561a and the fifth upper inner facet 561b. The second sidewall 562 of the third shared semiconductor pattern includes a sixth lower inner facet 562a, a sixth upper inner facet 562b on the sixth lower inner facet 562a, and a sixth connecting inner curved surface 562c connecting the sixth lower inner facet 562a and the sixth upper inner facet 562b. These facets and curved surfaces are otherwise as described above in connection with FIGS. 1 to 5.

The upper surface 563 of the third shared semiconductor pattern 560 can connect the first sidewall 561 of the third shared semiconductor pattern and the second sidewall 562 of the third shared semiconductor pattern. Unlike the upper surface 163 in FIGS. 1 to 5, the upper surface 563 of the third shared semiconductor pattern 560 has an almost sine wave appearance, e.g., has two convex regions joined by a concave region. In particular, the upper surface 563 of the third shared semiconductor pattern 560 may include a first convex region 563a that extends from the fifth upper inner facet 561b, a second convex region 563b that extends from the sixth upper inner facet 562b, and a concave region 563c connecting the first convex region 563a and second convex region 563b. As the first convex region 563a and second convex region 563b only begin where fifth upper inner facet 561b and the sixth upper inner facet 562b, e.g., the linear slope ends, sine wave is incomplete. Further, a vertex of the first convex region 563a may overlap the fifth seed film 551 along the third direction Z1, a vertex of the convex region 563b may overlap the sixth seed film 521 along the third direction Z1, and a vertex of the concave region 563c may overlap a vertex 564' of the bottom surface 564 of the third shared semiconductor pattern 560.

The bottom surface 564 of the third shared semiconductor pattern 560 may be formed between the second sidewall 510b of the fifth fin type pattern and the first sidewall 610a of the sixth fin type pattern. The bottom surface may otherwise be as described above in connection with FIGS. 1 to 5.

The third capping semiconductor pattern 565 may be formed on the third shared semiconductor pattern 560. The third capping semiconductor pattern 565 extends along the first sidewall 561 of the third shared semiconductor pattern, the upper surface 563 of the third shared semiconductor pattern and the second sidewall 562 of the third shared semiconductor pattern 560. The third capping semiconductor pattern 565 may include, e.g., silicon. The third capping semiconductor pattern 565 may include a first sidewall 566, a second sidewall 567, and an upper surface 568.

The first sidewall 566 of the third capping semiconductor pattern 565 corresponds to the first sidewall 561 of the third shared semiconductor pattern 560 and the second sidewall 567 of the third capping semiconductor pattern 565 corresponds to the second sidewall 562 of the third shared semiconductor pattern 560. The first sidewall 566 of the third capping semiconductor pattern may include a fifth lower outer facet 566a and a fifth upper outer facet 566b directly connected to the fifth lower outer facet 566a. The fifth lower outer facet 566a may be aligned with the fifth lower inner facet 561a and the fifth upper outer facet 566b may be aligned with the fifth upper inner facet 561b. The second sidewall 567 of the third capping semiconductor pattern may include a sixth lower outer facet 567a and a sixth upper outer facet 567b directly connected to the sixth lower outer facet 567a. The sixth lower outer facet 567a may be aligned with the sixth lower inner facet 562a and the sixth upper outer facet 567b may be aligned with the sixth upper inner facet 562b.

The upper surface 568 of third capping semiconductor pattern 565 may also include a first top outer facet 568a that extends from the fifth upper outer facet 566b along the third direction Z1 towards the substrate 100, a second top inner facet 568b that extends from the sixth upper outer facet 567b along the third direction Z1 towards the substrate 100, and a linear connecting portion 568c, i.e., a flat portion parallel to a bottom of the substrate 100, that connects the first top outer facet 568a and the second top inner facet 568b along the second direction Y1. For example, as illustrated in FIG. 20, the first top outer facet 568a and the second top inner facet 568b may be sloped to define a recess in the upper surface 568, such that the recess has the linear connection portion 568c at a center of its bottom, e.g., a cross-section of the recess with the linear connection portion 568c may have a truncated V-shape that overlaps a region between the fifth fin type pattern 510 and the sixth fin type pattern 610.

The fifth lower inner facet 561a, the fifth upper inner facet 561b, the sixth lower inner facet 562a, the sixth upper inner facet 662b, the fifth lower outer facet 566a, the fifth upper outer facet 566b, the sixth lower outer facet 567a the sixth upper outer facet 567b, the first top outer facet 568a, and the second top inner facet 568b may each be any of the crystal planes included in the group of {111} crystal planes.

Figure 21:
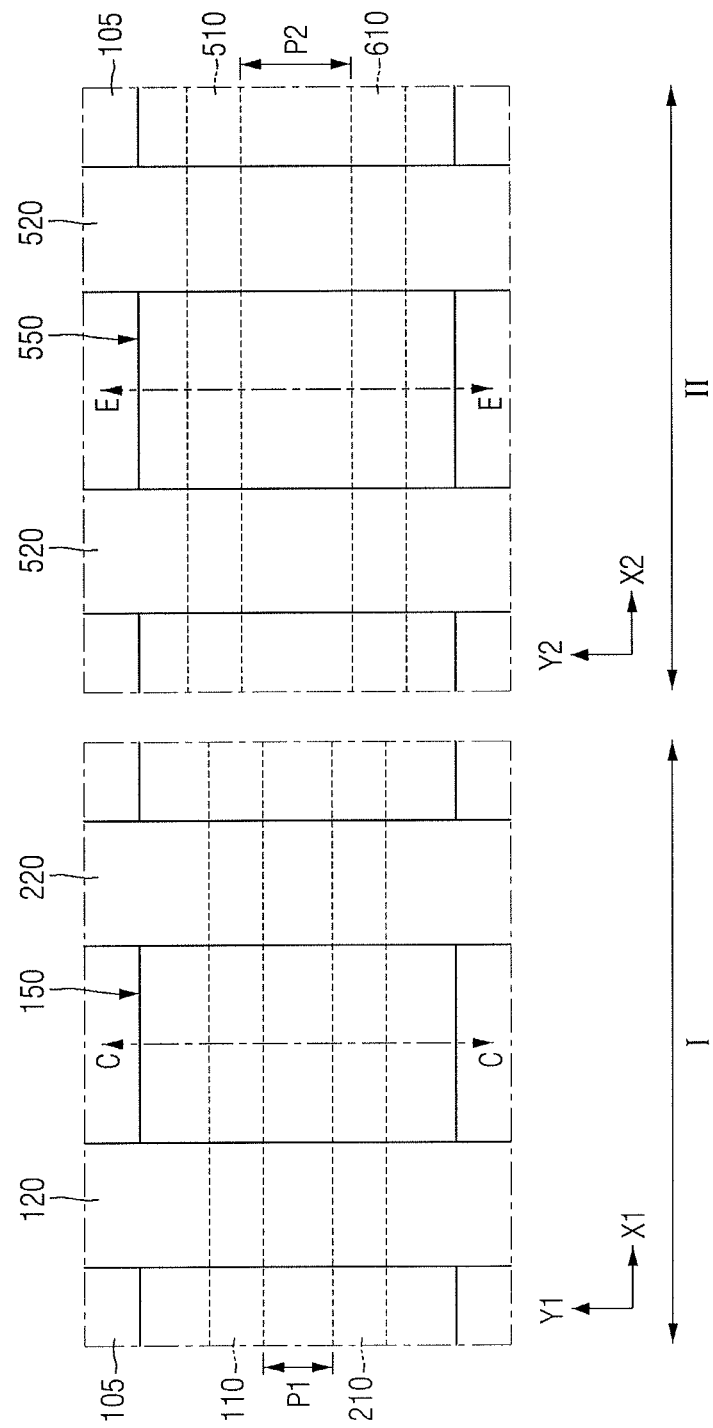
FIG. 21 illustrates a plan view for explaining the semiconductor device according to some embodiments.
Figure 22:
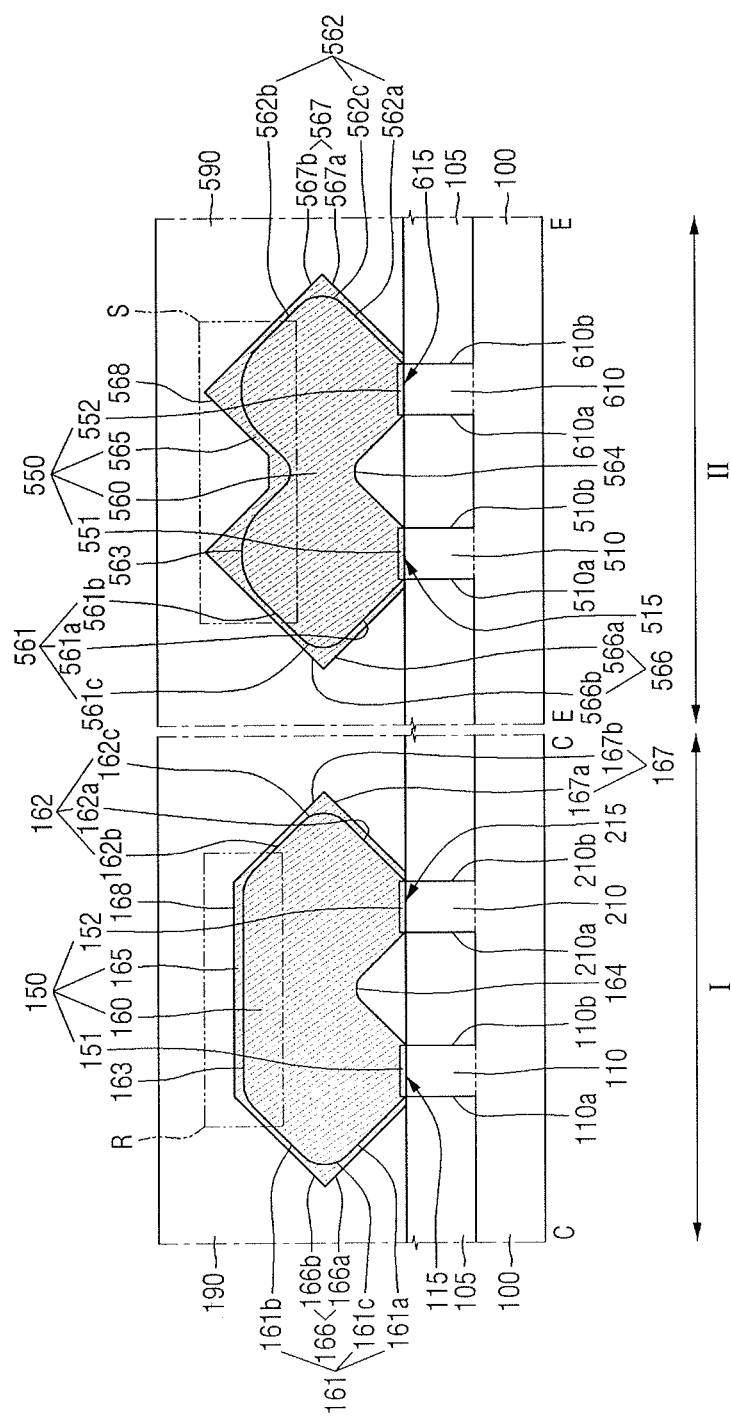
FIG. 22 illustrates a cross-sectional view taken along lines C-C and E-E of FIG. 21.
Figure 23A:
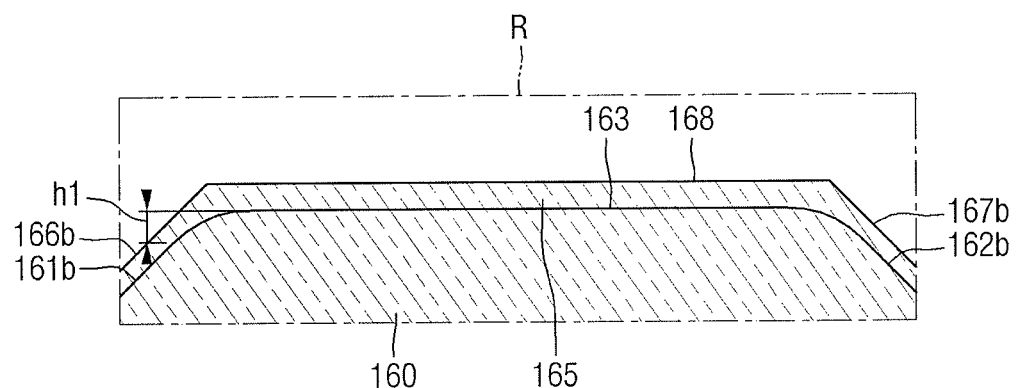
FIGS. 23A and 23B illustrate enlarged views of a region R and a region S of FIG. 22, respectively.
Figure 23B:
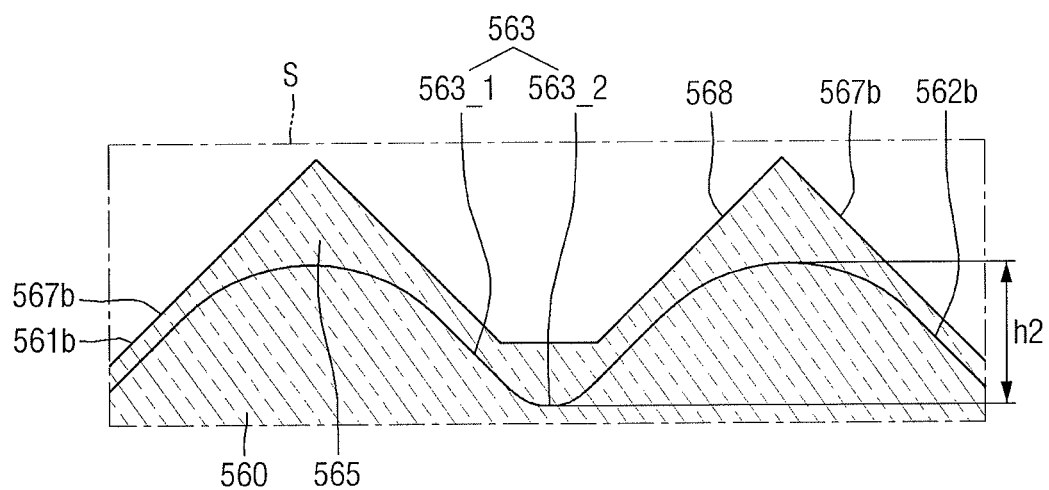

FIG. 21 is a plan view for explaining the semiconductor device according to some embodiments. FIG. 22 is a cross-sectional view taken along line C-C and line E-E of FIG. 21. FIGS. 23A and 23B are enlarged views of the region R and the region S of FIG. 22, respectively.

For reference, contents illustrated in the first region I of FIG. 21 is substantially the same as that described with reference to FIGS. 1 to 5, and contents illustrated in the second region II of FIG. 21 is substantially the same as that described with reference to FIG. 20. Further, each cross-sectional view taken along C-C and E-E of FIG. 21 is substantially the same as any one of FIGS. 4, 6, 8, 10 to 13, and 15.

Referring to FIGS. 21 to 23B, a semiconductor device according to some embodiments includes the first fin type pattern 110, the second fin type pattern 210, the fifth fin type pattern 510, the sixth fin type pattern 610, the first gate electrode 120, the second gate electrode 220, the fifth gate electrode 520, the sixth gate electrode 620, the first epitaxial pattern 150, and the third epitaxial pattern 550.

The substrate 100 may include a first region I and a second region II. For example, the first region I and the second region II may be regions in which transistors of the same conductivity type are formed, and may be regions in which PMOS transistors are formed.

The first fin type pattern 110, the second fin type pattern 210, the first gate electrode 120, the second gate electrode 220, and the first epitaxial pattern 150 may be in the first region I. The first fin type pattern 110 and the second fin type pattern 210 may be separated by a first pitch P1 along the first direction Y1.

The fifth fin type pattern 510, the sixth fin type pattern 610, the fifth gate electrode 520, the sixth gate electrode 620, and the third epitaxial pattern 550 may be in the second region II. The fifth fin type pattern 510 and the sixth fin type pattern 610 may be spaced apart along a fifth direction Y2 by a second pitch P2 greater than the first pitch P1.

In FIGS. 23A and 23B, the upper surface 163 of the first shared semiconductor pattern 160 and the upper surface 563 of the third shared semiconductor pattern 560 may respectively include a top portion and a bottom portion. In the semiconductor device according to some embodiments, a height difference h1 between the uppermost portion and the lowermost portion from the upper surface 163 of the first shared semiconductor pattern 160 is less than a height difference h2 between the uppermost portion and the lowest portion from the upper surface 563 of the third shared semiconductor pattern 560.

The upper surface 163 of the first shared semiconductor pattern may not contain facets with {111} crystal planes. However, the upper surface 563 of the third shared semiconductor pattern may have a first portion 563_1 including a facet having a {111} crystal plane and a second portion 563_2 connecting the first portion 563_1.

Figure 24:
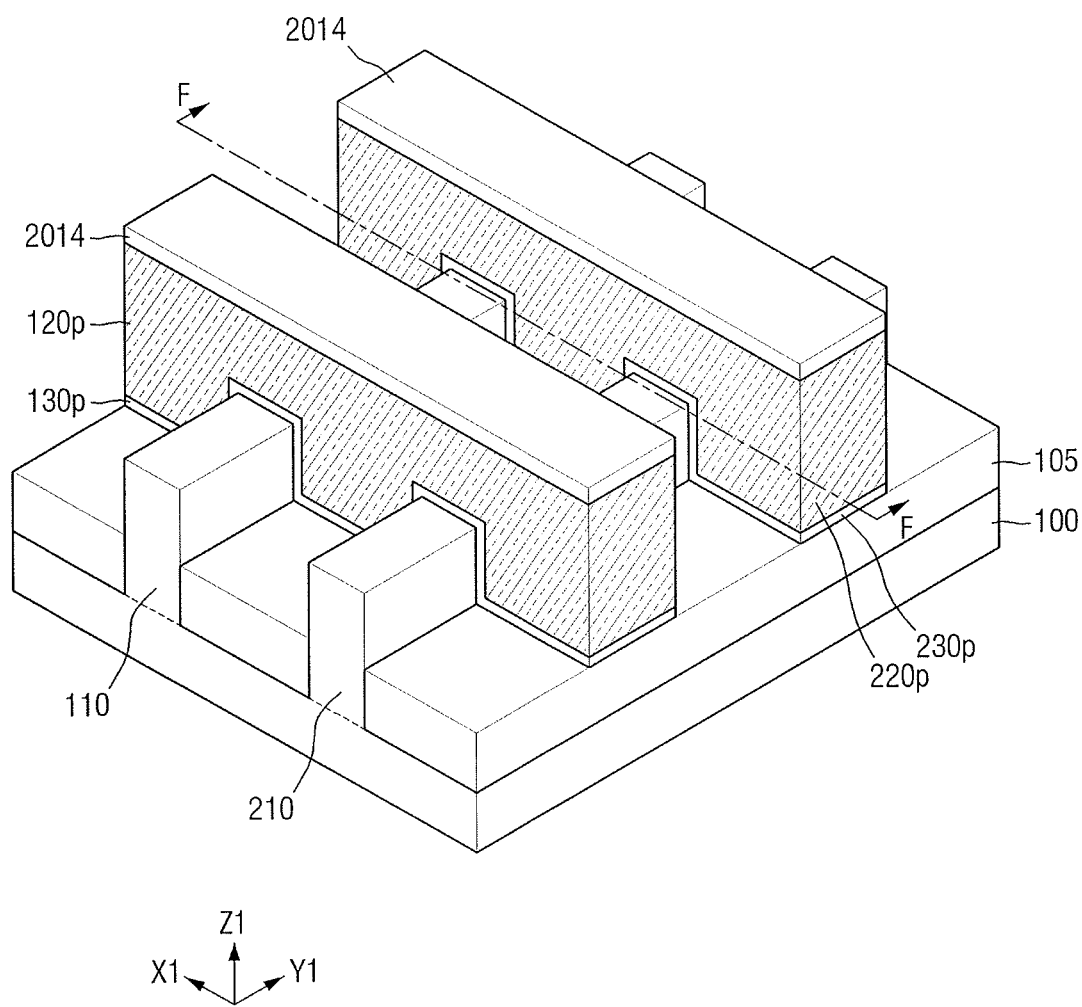
FIGS. 24 to 29 illustrate stages in a method for fabricating the semiconductor device according to some embodiments.
Figure 25:
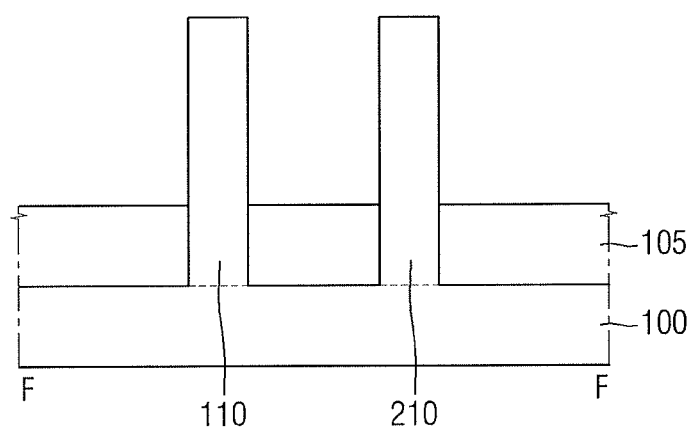

FIGS. 24 to 29 are intermediate views in stages of a method of manufacturing a semiconductor device according to some embodiments. For reference, FIG. 25 is a cross-sectional view taken along line F-F of FIG. 24. Further, the manufacturing method described with reference to FIGS. 26 to 29 is a manufacturing method performed from FIG. 25.

Referring to FIGS. 24 and 25, the first fin type pattern 110 and the second fin type pattern 210 are formed on the substrate 100. The first fin type pattern 110 and the second fin type pattern 210 can each extend long along the first direction X1. A field insulating film 105 covering a part of the sidewall of the first fin type pattern 110 and a part of the sidewall of the second fin type pattern 210 can be formed.

A first dummy gate electrode 120p and a second dummy gate electrode 220p crossing the first fin type pattern 110 are formed on the first fin type pattern 110 and the second fin type pattern 210 are formed. A mask pattern 2014 can be formed on the first dummy gate electrode 120p and the second dummy gate electrode 220p. A first dummy gate insulating film 130p between the first dummy gate electrode 120p and the substrate 100, and a second dummy gate insulating film 230p between the second dummy gate electrode 220p and the substrate 100 may be formed.

Figure 26:
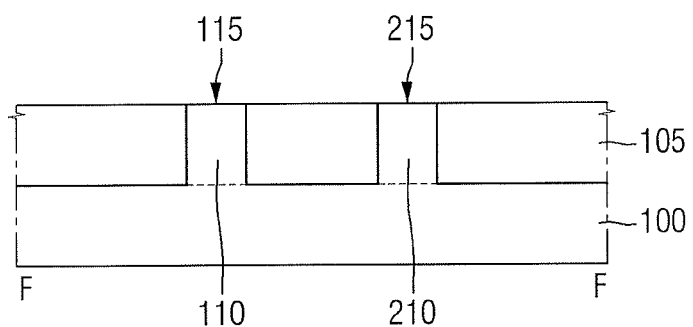

Referring to FIG. 26, a part of the first fin type pattern 110 and a part of the second fin type pattern 210 may be removed and the first recess 115 and the second recess 215 may be formed therein. The first recess 115 and the second recess 215 may be formed between the first dummy gate electrode 120p and the second dummy gate electrode 220p.

Figure 27:
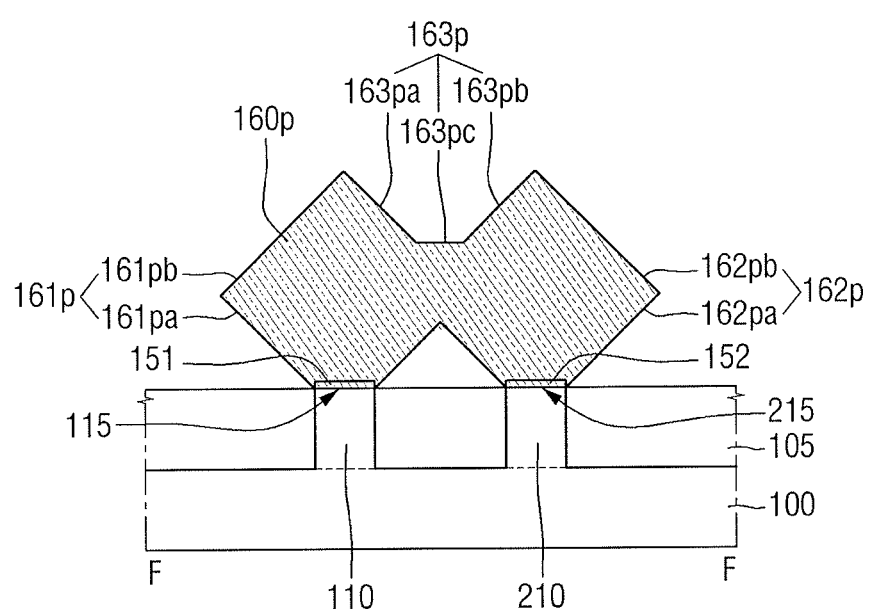

Referring to FIG. 27, the first seed film 151 may be formed on the first fin type pattern 110 and the second seed film 152 may be formed on the second fin type pattern 210. The first seed film 151 may be formed in the first recess 115 and the second seed film 152 may be formed in the second recess 215.

A pre-shared semiconductor pattern 160p may be formed on the first fin type pattern 110 and the second fin type pattern 210 on which the first seed film 151 and the second seed film 152 have been formed, respectively. The pre-shared semiconductor pattern 160p contains, e.g., silicon germanium. The pre-shared semiconductor pattern 160p may include a first pre sidewall 161p, a second pre sidewall 162p, and an upper pre surface 163p.

The first pre sidewall 161p and the second pre sidewall 162p may each include facets having a crystal plane included in a group of {111} crystal planes. The first pre sidewall 161p extends from the first fin type pattern 110 and the second pre sidewall 162p can extend from the second fin type pattern 210. The first pre sidewall 161p may include a first lower pre sidewall 161pa and a first upper pre sidewall 161pb that extend in a same fashion as the first lower inner facet 161a and the first upper inner facet 161b set forth above. The second pre sidewall 162p may include a second lower pre sidewall 162pa and a second upper pre sidewall 162pb that extend in a same fashion as the second lower inner facet 162a and the second upper inner facet 162b set forth above. However, as the first lower pre sidewall 161pa and the first upper pre sidewall 161pb directly meet at a point, no curved surface is present in the first pre sidewall 161p. Similarly, as the second lower pre sidewall 162pa and the second upper pre sidewall 161pb directly meet at a point, no curved surface is present in the second pre sidewall 162p.

The upper pre surface 163p may connect the first pre sidewall 161p and the second pre sidewall 162p. In particular, the upper pre surface 163p may include a first upper pre surface facet 163pa connected to the first upper pre sidewall 161pb at a point and a second upper pre surface facet 163pb connected to the second upper pre sidewall 162pb at a point. The first upper pre surface facet 163pa and the second upper pre surface facet 163pb may extend towards the substrate 100 along the third direction Z1 and towards each other along the first direction X1. The upper pre surface 163p may further include a connecting pre portion 163pc that extends in the first direction X1 and connects the first upper pre surface facet 163pa and the second upper pre surface facet 163pb.

Figure 28:
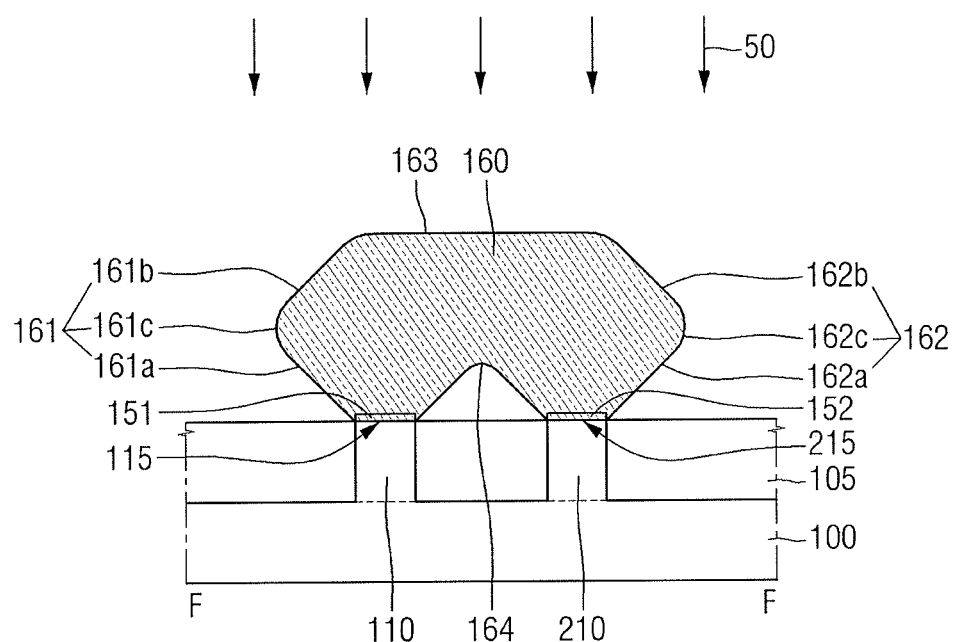

Referring to FIG. 28, the pre-shared semiconductor pattern 160p is subjected to a hydrogen treatment 50 to form the shared semiconductor pattern 160 on the first fin type pattern 110 and the second fin type pattern 210.

During the hydrogen treatment 50, the silicon germanium in the pre-shared semiconductor pattern 160p may move along the surface of the pre-shared semiconductor pattern 160p. That is, surface migration can occur. By the surface movement of silicon germanium, the first shared semiconductor pattern 160 may be formed on the first fin type pattern 110 and the second fin type pattern 210.

The first pre sidewall 161p becomes the first sidewall 161 of the first shared semiconductor pattern 160 via the hydrogen treatment 50 and the second pre sidewall 162p becomes the second sidewall 162 of the first shared semiconductor pattern 160. Further, the roughness of the upper surface of the pre-shared semiconductor pattern 160p can be reduced through hydrogen treatment 50. Thereby, the upper surface 163 of the first shared semiconductor pattern can be formed. In particular, the facets in the upper surface 163p may become be indistinguishable, e.g., the upper surface 163, or may become less distinct, e.g., the upper surface 563 of FIG. 20, depending on the duration of the hydrogen treatment 50. In either case, a thickness of the shared semiconductor pattern may be increased over a highest portion of the bottom surface of the shared semiconductor pattern.

The first sidewall 161 of the first shared semiconductor pattern 160 includes the first lower inner facet 161a, the first upper inner facet 161b, and the first connecting inner curved surface 161c for connecting the first lower inner facet 161a and the first upper inner facet 161b. The second sidewall 162 of the first shared semiconductor pattern 160 includes the second lower inner facet 162a, the second upper inner facet 162b, and a second connecting inner curved surface 162c that connects the second lower inner facet 162a and the second upper inner facet 162b.

Figure 29:
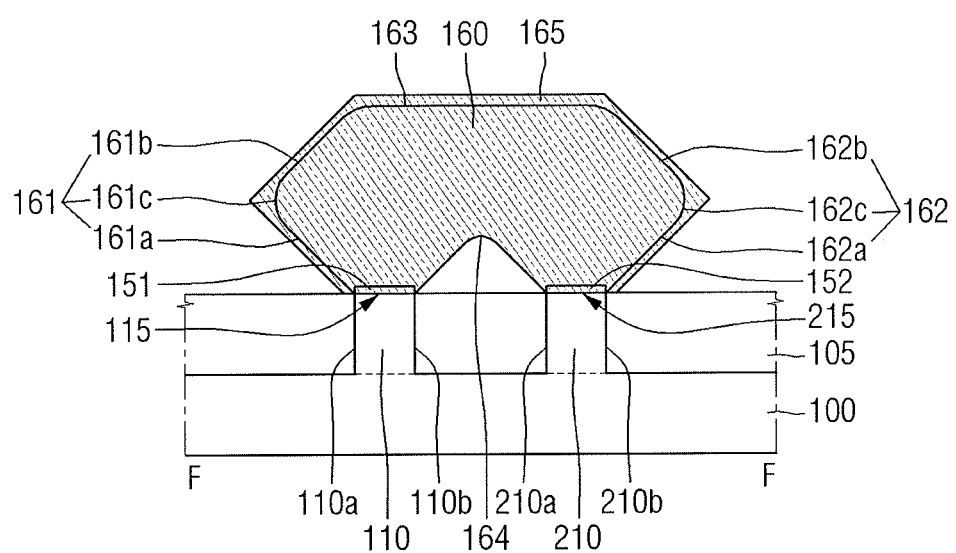

Referring to FIG. 29, the first capping semiconductor pattern 165 can be formed along the first sidewall 161 of the first shared semiconductor pattern 160, the upper surface 163 of the first shared semiconductor pattern 160, and the second sidewall 162 of the first shared semiconductor pattern 160.

By way of summation and review, embodiments may provide a semiconductor device capable of reducing the resistance between a semiconductor pattern and a contact, by adjusting the shape of the semiconductor pattern through the surface treatment of the epitaxial pattern. Other embodiments may provide a method for fabricating the semiconductor device capable of reducing the resistance between a semiconductor pattern and a contact, by adjusting the shape of the semiconductor pattern through the surface treatment of the epitaxial pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
a substrate;
a first fin type pattern disposed on the substrate;
a second fin type pattern disposed on the substrate;
a field insulation disposed on the substrate, and disposed between the first fin type pattern and the second fin type pattern;
a first gate disposed on the first fin type pattern, the second fin type pattern, and the field insulation;
a second gate disposed on the first fin type pattern, the second fin type pattern, and the field insulation; and
an epitaxial pattern disposed on the first fin type pattern and the second fin type pattern, the epitaxial pattern being included in a source/drain of a transistor,
wherein the epitaxial pattern includes:
  a shared semiconductor pattern disposed on the first fin type pattern and the second fin type pattern, the shared semiconductor pattern including a curved top surface and curved sidewall surfaces, and
  a capping semiconductor pattern disposed directly on the curved top surface and on the curved sidewall surfaces of the shared semiconductor pattern, the capping semiconductor pattern having a varying width, and an upper surface of the capping semiconductor pattern including a recess that includes a linear connecting portion that is parallel to a bottom of the substrate, and
wherein the capping semiconductor pattern is a single layer.

2. The semiconductor device of claim 1, wherein the linear connecting portion of the recess of the upper surface of the capping semiconductor pattern is disposed at a center portion of the recess.

3. The semiconductor device of claim 1, wherein:
the upper surface of the capping semiconductor pattern includes a first top portion disposed directly above the first fin type pattern and a second top portion disposed directly above the second fin type pattern, and
the recess of the upper surface of the capping semiconductor pattern is disposed between the first top portion and the second top portion, a width of the capping semiconductor pattern at each of the first and second top portions being larger than a width of the capping semiconductor pattern at a sidewall of the recess.

4. The semiconductor device of claim 1, wherein the recess of the upper surface of the capping semiconductor pattern has a cross-section of a truncated V-shape.

5. The semiconductor device of claim 1, wherein an upper surface of the shared semiconductor pattern includes a curved concave region that vertically overlaps with the recess of the upper surface of the capping semiconductor pattern.

6. The semiconductor device of claim 1, further comprising a contact disposed on the epitaxial pattern.

7. The semiconductor device of claim 1, wherein the capping semiconductor pattern covers sidewalls of the shared semiconductor pattern, and overlaps at least some of an upper surface of the shared semiconductor pattern.

8. A semiconductor device comprising:
a substrate;
a first fin type pattern disposed on the substrate;
a second fin type pattern disposed on the substrate;
a field insulation disposed on the substrate, and disposed between the first fin type pattern and the second fin type pattern;
a first gate disposed on the first fin type pattern, the second fin type pattern, and the field insulation;
a second gate disposed on the first fin type pattern, the second fin type pattern, and the field insulation;
a shared semiconductor pattern on the first fin type pattern and the second fin type pattern, the shared semiconductor pattern including a curved top surface and curved sidewall surfaces, and the shared semiconductor pattern being included in a transistor that uses the first fin type pattern and the second fin type pattern as a channel; and
a capping semiconductor pattern directly on the curved top surface and on the curved sidewall surfaces of the shared semiconductor pattern, the capping semiconductor pattern having a gradually varying width along the curved sidewall surfaces of the shared semiconductor pattern, and an upper surface of the capping semiconductor pattern having a recess that includes a linear connecting portion,
wherein the capping semiconductor pattern is a single layer.

9. The semiconductor device of claim 8, wherein an upper surface of the shared semiconductor pattern includes a curved concave region.

10. The semiconductor device of claim 8, further comprising a contact disposed on the shared semiconductor pattern.

11. The semiconductor device of claim 8, wherein the capping semiconductor pattern is a single layer directly on the shared semiconductor pattern, and the linear connecting portion is at a center region of the recess.

12. The semiconductor device of claim 11, wherein the recess of the upper surface of the capping semiconductor pattern has a cross-section of a truncated V-shape.

* * * * *